US012736869B2

(12) United States Patent
Song et al.

(10) Patent No.: US 12,736,869 B2
(45) Date of Patent: Sep. 15, 2026

(54) MASK FOR STITCHING EXPOSURE

(71) Applicant: KOREA ADVANCED INSTITUTE OF SCIENCE AND TECHNOLOGY, Daejeon (KR)

(72) Inventors: Jungchul Song, Daejeon (KR); Jae-Sub Oh, Daejeon (KR); Min Jun Park, Daejeon (KR); Hui Jae Cho, Daejeon (KR); Kwang Hee Kim, Daejeon (KR); Chang Hee Han, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 560 days.

(21) Appl. No.: 18/354,593

(22) Filed: Jul. 18, 2023

(65) Prior Publication Data

US 2023/0367201 A1 Nov. 16, 2023

Related U.S. Application Data

(63) Continuation of application No. PCT/KR2022/013889, filed on Sep. 16, 2022.

(30) Foreign Application Priority Data

Oct. 8, 2021 (KR) ........................ 10-2021-0133647

(51) Int. Cl.
*G03F 1/36* (2012.01)
*G03F 7/20* (2006.01)
*H10P 76/20* (2026.01)

(52) U.S. Cl.
CPC .............. *G03F 1/36* (2013.01); *G03F 7/2022* (2013.01); *H10P 76/2041* (2026.01)

(58) Field of Classification Search
CPC . G03F 1/36; G03F 7/2022; G03F 1/70; G03F 7/20; G03F 7/70475; H10P 76/2041
See application file for complete search history.

(56) References Cited

U.S. PATENT DOCUMENTS 5,437,946 A 8/1995 McCoy
8,009,270 B2 8/2011 Desmedt et al.
(Continued)

FOREIGN PATENT DOCUMENTS

CN 107402498 A 11/2017
JP 2006-156864 A 6/2006
(Continued)

OTHER PUBLICATIONS

Office Action, Jun. 18, 2024; Japanese Patent Application No. 2023-549831; JPO, Tokyo, Japan.
(Continued)

*Primary Examiner* — Stewart A Fraser
(74) *Attorney, Agent, or Firm* — Central California IP Group, P.C.; Andrew D. Fortney

(57) ABSTRACT

A method for forming a line and a space pattern, according to one embodiment of the present invention, comprises exposing a mask in a first direction and a second direction on a substrate and stitching same. The method for forming a line and a space pattern comprises the steps of: performing first exposure on the substrate so that first shots of the mask come in contact with each other in the first direction; and performing second exposure on the substrate so that second shots of the mask come in contact with each other so as to be distanced in the second direction and be offset with respect to the first shots in the first direction.

13 Claims, 18 Drawing Sheets

(56) References Cited

U.S. PATENT DOCUMENTS

| | | | | |
|---|---|---|---|---|
| 9,452,574 | B2 | 9/2016 | Resnick et al. | |
| 10,139,726 | B2 | 11/2018 | Park et al. | |
| 10,401,737 | B2 | 9/2019 | Hofmann et al. | |
| 10,527,933 | B2 | 1/2020 | Park et al. | |
| 2004/0032576 | A1* | 2/2004 | Kondo | G03F 7/70066 430/394 |
| 2008/0231826 | A1 | 9/2008 | Desmedt et al. | |
| 2012/0133915 | A1* | 5/2012 | Matsuyama | G03F 7/70116 355/77 |
| 2013/0153534 | A1 | 6/2013 | Resnick et al. | |
| 2014/0045334 | A1 | 2/2014 | Choi et al. | |
| 2015/0220679 | A1 | 8/2015 | Choi et al. | |
| 2017/0336547 | A1 | 11/2017 | Park et al. | |
| 2018/0173108 | A1 | 6/2018 | Hofmann et al. | |
| 2019/0064657 | A1 | 2/2019 | Park et al. | |

FOREIGN PATENT DOCUMENTS

| | | | |
|---|---|---|---|
| JP | 2007-193243 | A | 8/2007 |
| JP | 2008-235909 | A | 10/2008 |
| JP | 2016-133667 | A | 7/2016 |
| JP | 2018-101127 | A | 6/2018 |
| KR | 10-2007-0052035 | A | 5/2007 |
| KR | 10-2014-0021246 | A | 2/2014 |
| KR | 10-2014-0117425 | A | 10/2014 |
| KR | 10-2015-0114371 | A | 10/2015 |
| KR | 10-2017-0131766 | A | 11/2017 |
| KR | 10-2018-0008295 | A | 1/2018 |

OTHER PUBLICATIONS

International Search Report, International Application No. PCT/KR2022/013889; Jan. 12, 2023; Korean Intellectual Property Office, Daejeon, Republic of Korea.

1 Office Action, Mar. 24, 2026; Korean Patent Application No. 10-2025-0063857; KIPO, Daejeon, Korea.

Office Action, Apr. 11, 2026; Chinese Patent Application No. 202280015916.7; CNIPA, Beijing, China.

* cited by examiner

FIG. 17

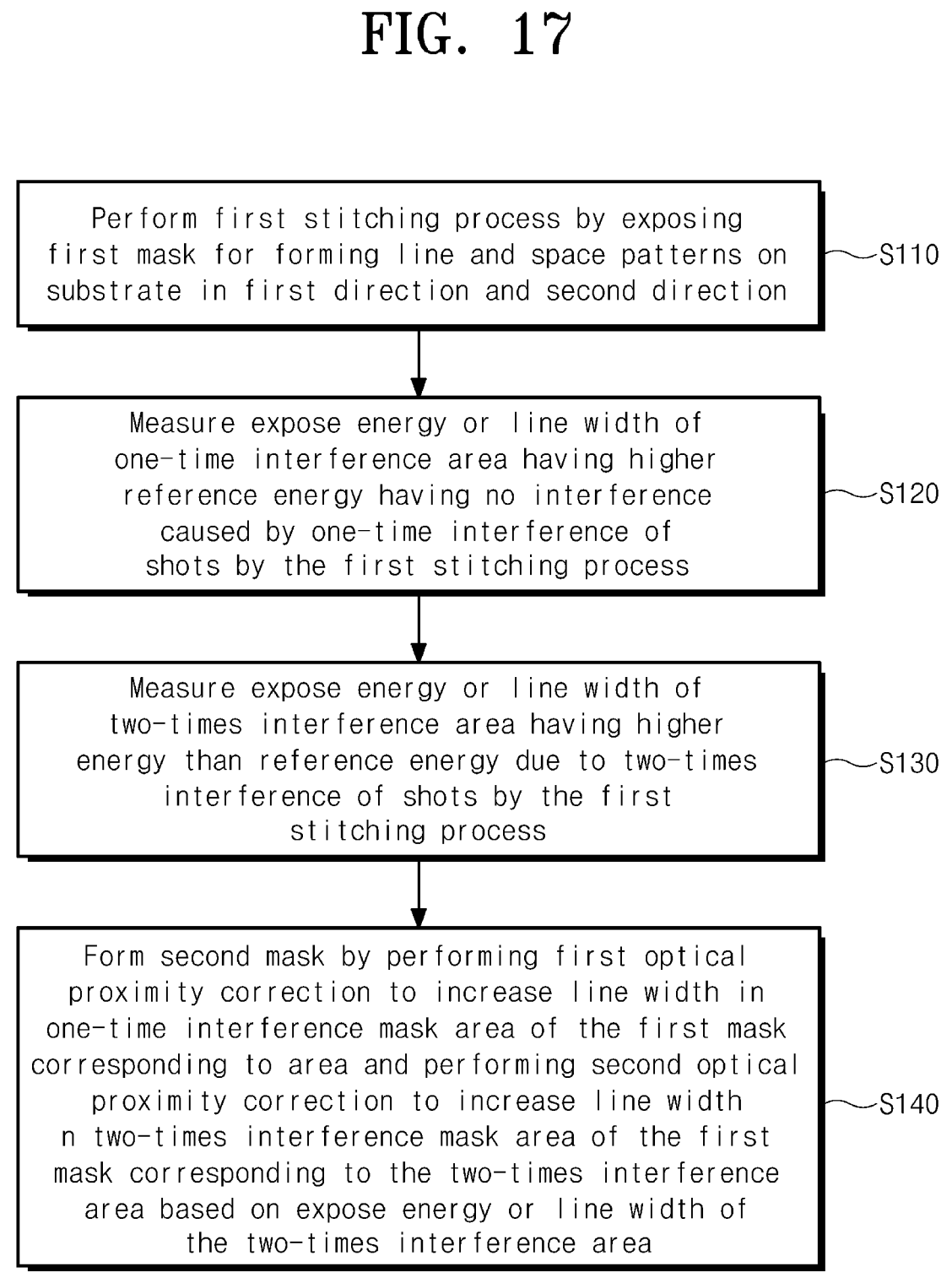

Perform first stitching process by exposing first mask for forming line and space patterns on substrate in first direction and second direction — S110

Measure expose energy or line width of one-time interference area having higher reference energy having no interference caused by one-time interference of shots by the first stitching process — S120

Measure expose energy or line width of two-times interference area having higher energy than reference energy due to two-times interference of shots by the first stitching process — S130

Form second mask by performing first optical proximity correction to increase line width in one-time interference mask area of the first mask corresponding to area and performing second optical proximity correction to increase line width n two-times interference mask area of the first mask corresponding to the two-times interference area based on expose energy or line width of the two-times interference area — S140

MASK FOR STITCHING EXPOSURE

CROSS-REFERENCE TO RELATED APPLICATIONS

This application is a continuation of and claims priority to PCT/KR2022/013889 filed on Sep. 16, 2022, which claims priority to Korea Patent Application No. 10-2021-0133647 filed on Oct. 8, 2021, the entireties of which are both hereby incorporated by reference.

TECHNICAL FIELD

The present disclosure relates to optical proximity correction of a photomask, and more particularly, to a line and space pattern mask for optical proximity correction removing an interference effect of shots caused by a stitching exposure process.

BACKGROUND ART

A wire grid polarizer is an array of parallel wires disposed on a surface of a substrate such as glass. The wire grid polarizer is formed in nano-scaled a line and space pattern. Conventionally, when a period (or a pitch) of a wire grid is smaller than a wavelength of light, the wire grid operates as a polarizer.

In the case of a metal wire grid polarizer used in a polarization imaging device, S-waves reflected and emitted are re-reflected and scattered by an ambient optical unit and a mechanical unit within the imaging device to deteriorate a polarized image. Accordingly, there is demand for a method of reducing s-wave reflection of a metal wire grid-based polarizer and enhancing transmittance of p-waves.

In a wire grid polarization filter, a contrast ratio C/R increases as a line width of a wire grid decreases and a height of the wire grid increases. Accordingly, there is demand for a process in which a line width of the wire grid is 50 nm or less.

On the other hand, the wire grid polarization filter requires a large area to be used as a large-diameter polarization filter for a camera or a flexible display. However, a stitching exposure process may be used as a method of forming a die having a large area. The stitching exposure process is a technique of continuously combining a plurality of shots to form a die or chip having a size, larger than a size (a shot field) of a photomask.

Conventionally, exposure areas (shot fields) of an exposure device are spaced apart from each other at regular intervals. Such an interval is referred to as a scribe line, and markers are engraved to cut or align chips. Accordingly, masks are generally spaced apart from each other. A stitching exposure process of forming a pattern, where an interval between masks is "0," is not used. In the stitching exposure process, four shots are disposed adjacent to each other on a substrate, so that interference occurs between shots.

In particular, in the case of a line and space pattern in which a line has a line width of 50 nm or less, four shots are disposed adjacent to each other. Accordingly, at a pitch of 100 nm, interference between shots may occur three times, so that a line and space pattern cannot be formed.

Accordingly, there is demand for a novel method of performing a stitching process even in the case of a line and space pattern in which a line width of a photoresist line is about 50 nm.

DISCLOSURE OF THE INVENTION

Technical Problem

The present disclosure provides a novel stitching process, capable of performing a stitching process on a line and space pattern, and a novel mask for a stitching process.

The present disclosure provides a novel stitching process, capable of significantly reducing a thickness of a photoresist, caused by an interference, by a stitching exposure process, and a novel mask for a stitching process.

The present disclosure provides a novel stitching process, performing optical proximity correction to provide a uniform line width in a stitching exposure process, and a novel mask for a stitching process.

Technical Solution

In a method of forming a line and space pattern according to an example embodiment of the present disclosure, a mask is exposed on a substrate in a first direction and a second direction to perform a stitching process. The method includes: performing a first exposure process on the substrate such that first shots of the mask contact each other in the first direction; and performing a second exposure process on the substrate such that second shots of the mask contact each other to be spaced apart from the first shots in the second directions and have an offset with the first shots.

In an example embodiment, the offset may be greater than a width of an interference area of the shots.

In an example embodiment, each of the first shots and the second shots may include a reference energy area exposed to reference energy; a one-time interference area having energy higher than the reference energy due to interference of the first shots and the second shots; and a two-times interference area having energy higher than the reference energy due to interference of the first shots and the second shots.

In an example embodiment, a one-time interference mask area of the mask corresponding to the one-time interference area may have a first mask line width greater than a basic mask line width of a reference energy mask area of the mask corresponding to the reference energy area. A two-times energy mask area of the mask corresponding to the two-times interference area may have a second mask line width greater than a mask line width of the reference energy mask area of the mask corresponding to the reference energy area.

In an example embodiment, a pitch of the line and space pattern may be the same in the first shots and the second shots, and a pitch of photoresist of the line and space pattern may be 80 nm to 140 nm.

In an example embodiment, the reference energy area may have a shape of a rectangle disposed in a rectangular shot and is disposed in a center of shots, the one-time interference area may be disposed on a side to surround the reference energy area, and the two-times interference area may be locally disposed between vertices of a reference energy area and a pair of vertices in the first direction.

In an example embodiment, the mask may include: a rectangular reference energy mask area; a left area and a right area, respectively disposed on left and right sides of the reference energy mask area; an upper left vertex area and an upper right vertex area, respectively disposed in an upper left portion and an upper right portion of the reference energy mask area; an lower left vertex area and an upper lower vertex area, respectively disposed in a lower left portion and a lower right portion of the reference energy mask area; an upper area disposed above the reference energy mask area; an upper left area disposed between the upper area and the upper left vertex area; an upper right area disposed between the upper area and the upper right vertex area; a lower area disposed below the reference energy mask area; a lower left area disposed between the lower area and the lower left vertex area; and an lower right area disposed between the lower area and the lower left vertex area. A line width of the reference energy mask area may be a basic mask line width, line widths of the left area, the right area, the upper left area, the upper right area, the lower left area, and lower right area may be the same as a first mask line width, line widths of the upper area, the lower area, the upper left vertex area, the upper right vertex area, the lower left vertex area, and the lower right vertex area may be the same as a second mask line width, the second mask line width may be greater than the first mask line width, and the first mask line width may be greater than the basic mask line width.

In an example embodiment, the reference mask line width may be 50 nm, the first mask line width may be 56 nm, and the second mask line width may be 60 nm.

In an example embodiment, a wire grid polarizer manufactured by the method of forming the line and space pattern, as set forth in claim 1.

In a mask for forming a line and space pattern according to an example embodiment of the present disclosure, a stitching process is performed on a substrate by exposing a mask in a first direction and a second direction. The mask may include a rectangular reference energy mask area formed on a mask substrate in the first direction and the second direction; a one-time interference mask area disposed on a side to surround the reference energy mask area; and a two-times interference mask area locally disposed between vertices of the reference energy mask area and a pair of vertices in the first direction. The reference energy mask area may have a basic mask line width, the one-time interference mask area may have a first mask line width, the two-times interference mask area may have a second mask line width, the second mask line width may be greater than the first mask line width, and the first mask line width may be greater than the basic mask line width.

In an example embodiment, the basic mask line width may be 50 nm, the first mask line width may be 56 nm, and the second mask line width may be 60 nm.

In a mask for forming a line and space pattern, a stitching process is performed on a substrate by exposing a mask in a first direction and a second direction. The mask includes a rectangular reference energy mask area; a left area and a right area, respectively disposed on left and right sides of the reference energy mask area; an upper left vertex area and an upper right vertex area, respectively disposed in an upper left portion and an upper right portion of the reference energy mask area; an lower left vertex area and an upper lower vertex area, respectively disposed in a lower left portion and a lower right portion of the reference energy mask area; an upper area disposed above the reference energy mask area; an upper left area disposed between the upper area and the upper left vertex area; an upper right area disposed between the upper area and the upper right vertex area; a lower area disposed below the reference energy mask area; a lower left area disposed between the lower area and the lower left vertex area; and an lower right area disposed between the lower area and the lower left vertex area. A line width of the reference energy mask area may be a basic mask line width, line widths of the left area, the right area, the upper left area, the upper right area, the lower left area, and lower right area may be the same as a first mask line width, line widths of the upper area, the lower area, the upper left vertex area, the upper right vertex area, the lower left vertex area, and the lower right vertex area may be the same as a second mask line width, the second mask line width may be greater than the basic mask line width, and the first mask line width may be greater than the basic mask line width.

In an example embodiment, the basic mask line width may be 50 nm, the first mask line width may be 56 nm, and the second mask line width may be 60 nm.

A method of manufacturing a mask for forming a line and space pattern according to an example embodiment of the present disclosure includes exposing a first mask for forming a line and space pattern on a substrate in a first direction and a second direction to perform a first stitching process; measuring expose energy or line width of a one-time interference area having energy higher than reference energy having no interference due to one-time interference of shots through the first stitching process; measuring expose energy or line width of a two-times interference area having energy higher than the reference energy due to two-times interference of shots through the first stitching process; and forming a second mask by performing first optical proximity correction to increase a line width in a one-time interference mask area of the first mask corresponding to the one-time interference area based on the expose energy or the line width of the one-time interference area and by performing second optical proximity correction to increase line width in a two-times interference mask area of the first mask corresponding to the two-times interference area based on the expose energy or the line width of the two-times interference area In an example embodiment, the first stitching process may include performing a first exposure process on the substrate such that first shots of the first mask contact each other in the first direction; and performing a second exposure process on the substrate such that second shots of the first mask contact each other to be spaced apart from the first shots in the second direction to have an offset with the first shots.

In an example embodiment, the first optical proximity correction may increase a line width of a line by a first variance while having the same pitch, the second optical proximity correction may increase a line width of a line by a second variance while having the same pitch, the second variance may be greater than the first variance, and the first variance may be proportional to a difference between expose energy of the one-time interference area and basic expose energy of an interference-free area.

Advantageous Effects

A mask according to an example embodiment of the present disclosure may form a wire grid polarizer on an entire substrate by performing a switch process on a line and space pattern.

A wire grid polarizer according to an example embodiment of the present disclosure may be formed by cutting a line and space pattern, formed by a stitching process, into a predetermined size.

BRIEF DESCRIPTION OF THE DRAWINGS

FIG. 17 is a flowchart illustrating a method of manufacturing a mask for forming a line and space pattern.

MODE FOR CARRYING OUT THE INVENTION

Figure 1:
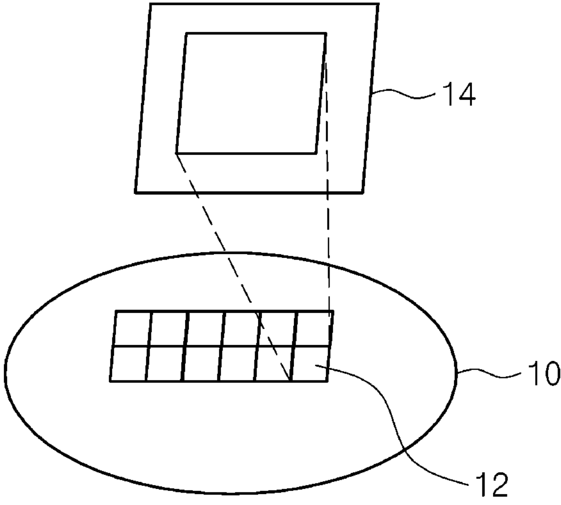
FIG. 1 is a conceptual diagram illustrating that an entire substrate is exposed by a stitching process according to an example embodiment of the present disclosure.

Flare interference occurs up to 10 um outside a shot field area due to shot field interference. For this reason, uniformity of expose energy varies spatially and an interference area exceeding reference expose energy is formed.

Shot field interference or shot interference forms a three-times interference area, and a pattern of the three-times interference area is collapsed due to energy overexposure. In addition, the three-times interference area cannot be corrected through optical proximity correction (OPC) under the condition of a line width of 50 nm. On the other hand, the three-times interference area may be corrected through optical proximity correction (OPC) under the condition of a line width of 60 nm. However, when optical proximity correction (OPC) is performed on the three-times interference area, a thickness of a photoresist (PR) pattern is significantly reduced. Accordingly, when a lower conductive layer is etched using the photoresist pattern as an etch mask, an etching depth is limited and an etching selectivity or an etching aspect ratio is significantly reduced. Accordingly, performance of a metal wire grid polarizer is deteriorated.

In the stitching method according to an example embodiment of the present disclosure, the three-times interference area may be removed using offset of shots to generate only a one-time interference area and a two-times interference area. The one-time interference area and the two-times interference area may increase a range of pitches that can be patterned. Meanwhile, line widths of photoresists in the one-time interference area and the two-times interference area may be decreased.

According to an example embodiment of the present disclosure, the decrease in line width of the photoresist in the one-time interference area and/or the two-times interference area may be corrected through optical proximity correction (OPC) of a mask. The one-time interference area and the two-times interference area may be corrected through optical proximity correction (OPC) of the mask. Accordingly, the same line width may be obtained in all areas. In addition, the three-times interference area may be removed to extend conditions for performing optical proximity correction (OPC). In addition, the three-times interference area may be removed to suppress a decrease in thickness of the remaining photoresist.

According to an example embodiment of the present disclosure, even when a pattern collapses in a two-times interference area, pattern collapse in the two-times interference area may be suppressed through optical proximity correction (OPC).

Hereinafter, example embodiments will now be described more fully with reference to the accompanying drawings, in which some example embodiments are shown. Example embodiments may, however, be embodied in many different forms and should not be construed as being limited to the embodiments set forth herein. Rather, these example embodiments are provided so that this disclosure will be thorough and complete, and will fully convey the scope of example embodiments of the present disclosure to those of ordinary skill in the art. In the drawings, the thicknesses of layers and areas are exaggerated for clarity. Like reference characters and/or numerals in the drawings denote like elements.

FIG. 1 is a conceptual diagram illustrating that an entire substrate is exposed by a stitching process according to an example embodiment of the present disclosure.

Figure 2:
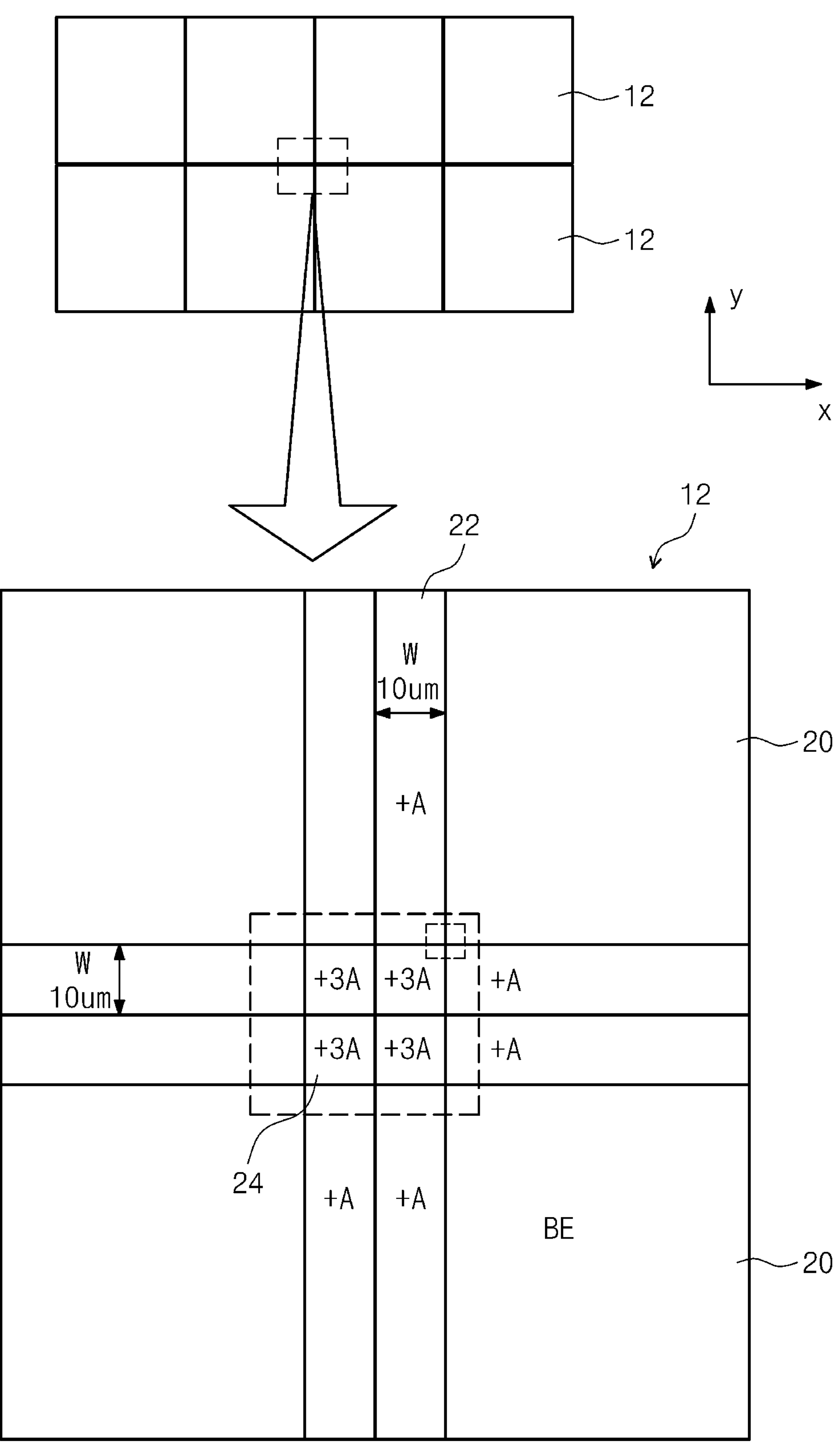
FIG. 2 is an enlarged view illustrating an interference form of shots by the stitching process of FIG. 1.

FIG. 2 is an enlarged view illustrating an interference form of shots by the stitching process of FIG. 1.

Figure 3:
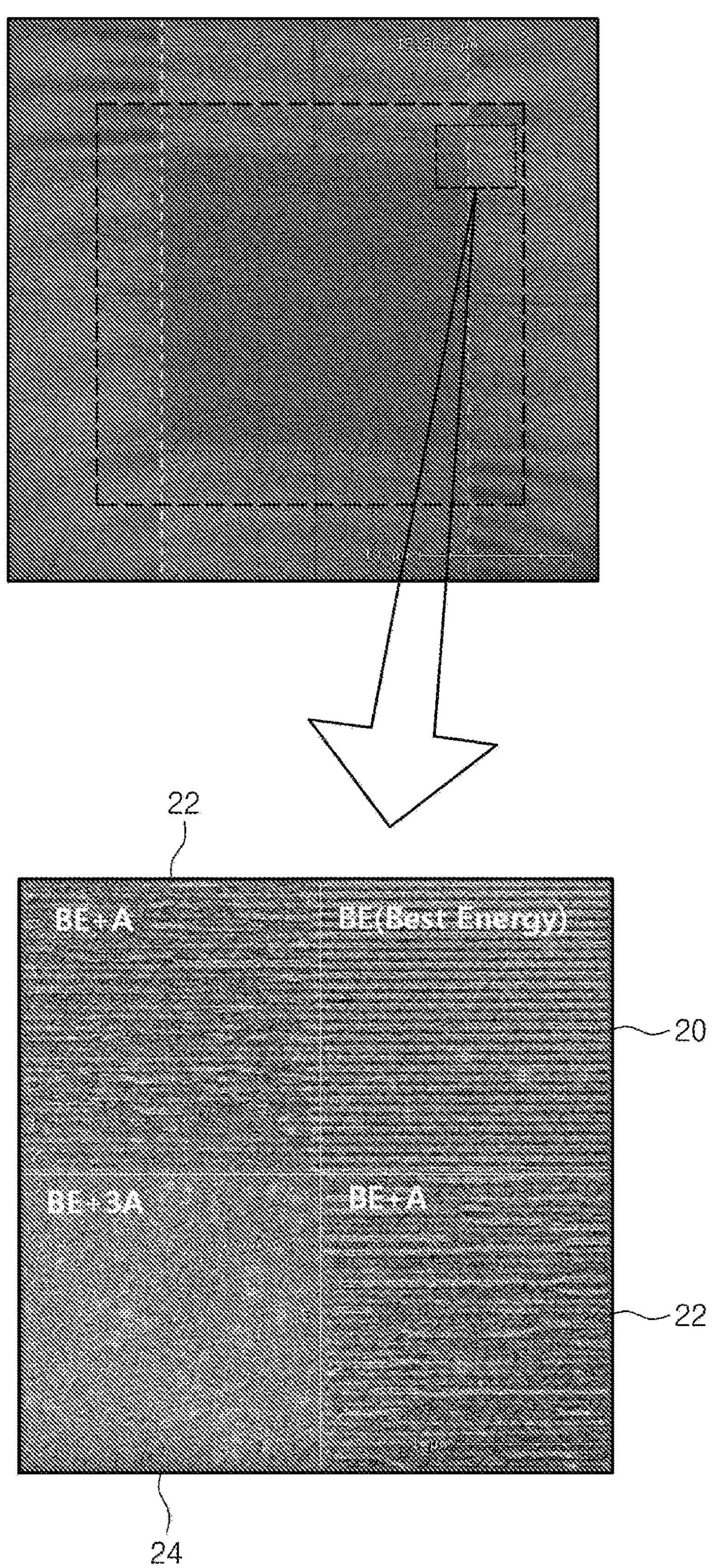
FIG. 3 is an electron microscope image illustrating an interference form of the shots of FIG. 2.

FIG. 3 is an electron microscope image illustrating an interference form of the shots of FIG. 2.

Figure 4:
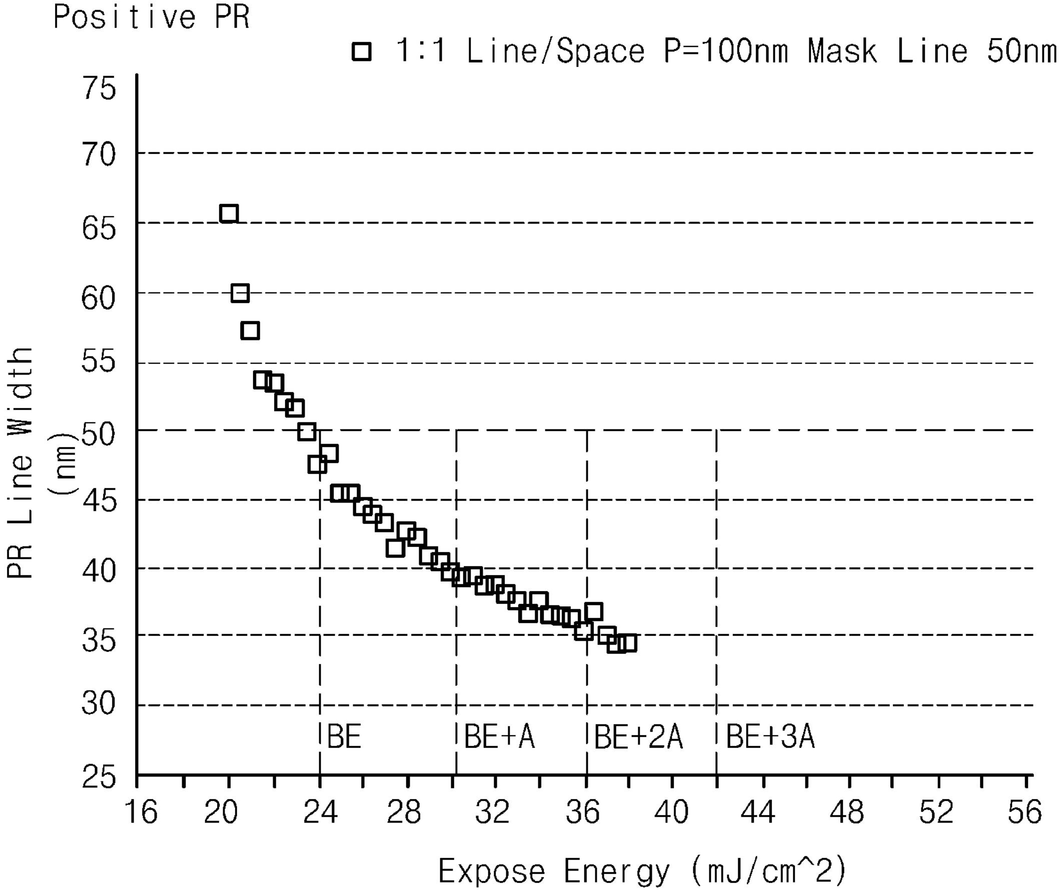
FIG. 4 is a graph illustrating a line width of a photoresist depending on expose energy under conditions of a mask pitch (P=100 nm) and a mask line width (LW=50 nm).

FIG. 4 is a graph illustrating a line width of a photoresist depending on expose energy under conditions of a mask pitch (P=100 nm) and a mask line width (LW=50 nm).

Referring to FIGS. 1 to 4, the stitching process may expose a plurality of shots 12 in a first direction (an x-axis direction). After the plurality of shots are spaced in a second direction (a y-axis direction) at predetermined intervals, they are exposed again in the first direction. Accordingly, the shots 12 may be arranged in a matrix form. Each of the shots 12 may be exposed in a rectangular shape. Each shot is an area in which the mask 14 is exposed by an exposure device to form a pattern on photoresist on a substrate.

Each of the shots 12 may have a rectangular shape. Each of the shots 12 may have a reference energy area 20 in a center in which no interference is formed, a one-time interference area 22 having one-time interference on a side of a rectangle, and a three-times interference area 24 having three-times shot interference at a vertex of the rectangle. A width W of the one-time interference area 22 may be about 10 um. A width of the three-times interference area 24 may be about 10 um. A width W of an interference area may be determined by shot field flare interference.

The width W of the interference area may depend on the Local Flare Effect. Deep ultra violet (DUV) lithography passes through a reticle or a mask, and then passes through several tens of projection lenses to generates a lot of stray lights. The stray light may be generated due to a flare phenomenon. In a DUV lithography process, most stray light causes flare in an area of 10 um. The exposure device may be an ArF immersion scanner or an ArF stepper. The photoresist may be a positive photoresist.

When the stitching process is performed in a line and space pattern having a line width of 100 nm or more, an effect of shot interference may be relatively small as compared with line width. That is, in a line and space pattern process of 100 nm or more, sensitivity of a photoresist reaction may be low.

However, as a line width of a line decreases to 100 nm or less, a section in which a line and space pattern based on energy variation of photoresist remain standing without tipping over may be reduced. An appropriate range of energy should be exposed in order for the width of the line to be a line width, at which the patterns remain standing without tripping over, for example, an effective line width. A critical dimension (CD) value may vary depending on a variance of expose energy. An effective energy variation range becomes an energy latitude. The larger the energy latitude, the more stably a stitching pattern formation process may be performed.

For example, in the case of DUV lithography, an interference phenomenon caused by a local flare effect occurs up to 10 um beyond each shot area.

In the case of a line pattern of 100 nm, the line pattern may be formed to a level at which a line width is decreased by 10 to 20 nm. However, in the case of a line width of 50 nm, a photoresist may be completely removed by an effect flare, so that no pattern may be formed.

According to the present disclosure, an energy latitude may be about ±9% in a reference energy area 20 and the reference energy area 20 may have expose energy of reference energy BE. A one-time interference area 22 may be an area in which interference of shots occurs once, and may have energy exposure of BE+A with one-time interference. "A" is expose energy (about 6 mJ/cm^2) added by one-time interference. A three-times interference area 124 may be an area in which interference of shots occurs three times, and has energy exposure of BE+3A with three-times interference. That is, BE+A is 125% compared with the reference energy BE, and BE+3A is 175% compared with the reference energy BE.

As a result of identifying interference amounts of the one-time interference area 22 and the three-times interference area 24, the interference amount "A" is about 20 to about 30% of BE, and is about 6 mJ/cm^2. For example, the reference energy BE is about 24 mJ/cm^2, and BE+A is about 30 mJ/cm^2. BE+3A is about 48 mJ/cm^2. That is, the expose energy increases in proportion to the reference energy BE depending on the number of interferences.

A line width of a smallest mask, which may be provided by an ArF immersion lithography apparatus, may be 38 nm. A line pattern of a smaller mask may prevent light from passing therethrough.

To perform a stitching process on a photoresist line pattern of 50 nm, positive photoresist may include a 50 nm line of a mask (a portion in which light is blocked by a reticle) and a 50 nm space of the mask (a portion through which light passes). A sum of a line width of the mask and a line width of the space is equal to a pitch.

A pitch of photoresist on an entire surface of a substrate including an interference area should be 100 nm, and a line width of the photoresist should be 50 nm.

When the reference energy (BE) of the expose energy for achieving a line width of 50 nm in the line and space pattern of the photoresist is 100%, a three-times interference area, which is an excess energy section caused by interference, may be BE+3A and receives 175% of energy compared with the reference energy.

Referring to FIG. 4, the energy of the three-times interference area 24 is 175%, so that a line width of photoresist may have a significantly reduced line width rather than 50 nm. According to the experimental results using an ArF exposure device, a line pattern collapses.

On the other hand, even when optical proximity correction (OPC) is performed to prevent the pattern of the three-time interference area 24 from collapsing, a critical dimension of a mask may include a space width of 38 nm and a line of 62 nm (a light transmission portion is significantly reduced) at a mask pitch of 100 nm. A space, a mask critical dimension, may be determined by a wavelength of an exposure device and optical characteristics of a lens.

Even when 38 nm is applied as a space width of the mask, the expose energy may be about 160% to implement a line width of 50 nm of the photoresist. However, 175% of energy is exposed to the three-times interference area, so that a pattern cannot be formed.

As a result, correction can be no longer performed to 38 nm or less even by performing optical proximity correction (OPC) on the mask. Accordingly, with the three-times interference area 24, a stitching line and space pattern having a line width of 50 nm of photoresist cannot be formed.

Figure 5:
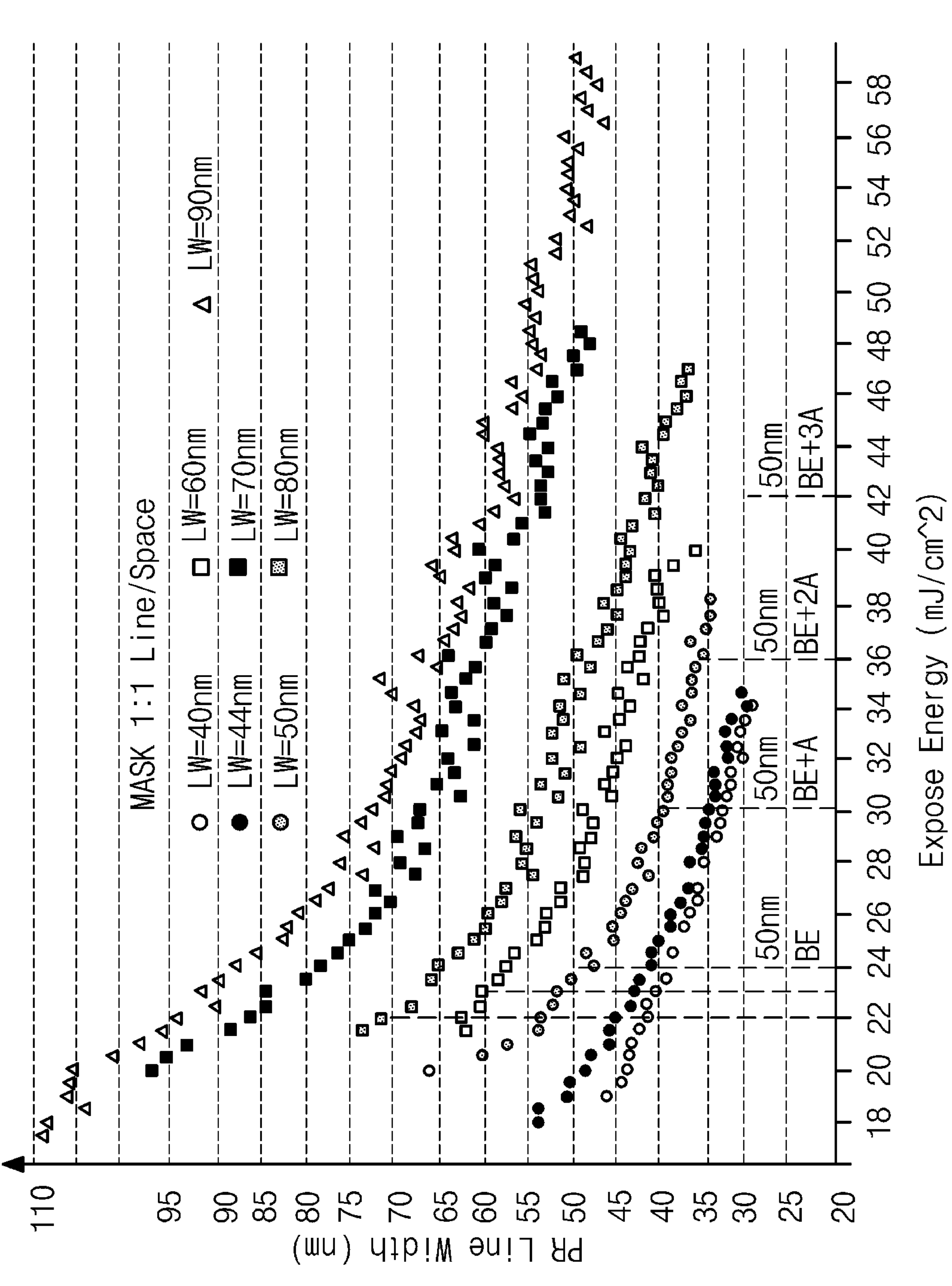
FIG. 5 is an experimental result illustrating a line width of a photoresist depending on expose energy for each line width of a mask according to an example embodiment of the present disclosure.

FIG. 5 is an experimental result illustrating a line width of a photoresist depending on expose energy for each line width of a mask according to an example embodiment of the present disclosure.

Referring to FIG. 5, a mask pitch is twice a make line width. Mask line widths are 40 nm (hollow circles), 44 nm (black circles), 50 nm (gray circles), 60 nm (hollow squares), 70 nm (black squares), 80 nm (grey squares), and 90 nm (triangles), respectively. Accordingly, mask pitches are 80, 84, 100, 120, 140, 160, and 180 nm, respectively.

For a mask line width of 50 nm, reference energy of an ArF exposure device is 24 mJ/cm^2. When the expose energy is 36 mJ/cm^2 or more, a photoresist pattern is not formed. Since the three-times interference area has an energy of 42 mJ/cm^2, a photoresist pattern is not formed.

For a mask line width of 60 nm, the reference energy is 23 mJ/cm^2. When the expose energy is 40 mJ/cm^2 or more, the photoresist pattern may not be formed. Since the three-times interference area has an energy of 41 mJ/cm^2 (=23+3×6), a photoresist pattern may not be formed.

For a mask line width of 70 nm, the reference energy is 20 mJ/cm^2. When the expose energy is 46 mJ/cm^2 or more, the photoresist pattern may not be formed. Since the three-times interference area has energy of 42 mJ/cm^2

(=20+3×6), a photoresist pattern may be formed. However, in the three-times interference area, a line width of photoresist may be significantly reduced, so that stable wire grid polarizer characteristics cannot be provided. In the three-times interference area, a thickness of the photoresist is significantly reduced to make subsequent etching processes difficult.

For mask line widths of 40 nm and 44 nm, the reference energy is about 23 mJ/cm^2. When the expose energy is about 34 mJ/cm^2 or more, a photoresist pattern may not be formed. Since the two-times interference area has an energy of 35 mJ/cm^2(23+2×6), a photoresist pattern may not be formed.

When the stitching process of the present disclosure is used, a three-times interference area is removed, so that the stitching process may be performed at a mask line width of 50 nm (a pitch of 100 nm) and a mask line width of 60 nm (a pitch of 120 nm).

When the stitching process of the present disclosure is used, a three-times interference area may be removed and the stitching process may be performed through proximity optical correction to be described later at a mask line width of 40 nm (a pitch of 80 nm) and a mask line width of 44 nm (a pitch of 880 nm). Accordingly, a photoresist pattern may be formed.

In addition, when the stitching process of the present disclosure is used, the stitching process may be performed at a mask line width of 70 nm (a pitch of 140 nm) or more. Since the stitching process of the present disclosure removes a gray interference area, a stable photoresist pattern may be formed.

Figure 6:
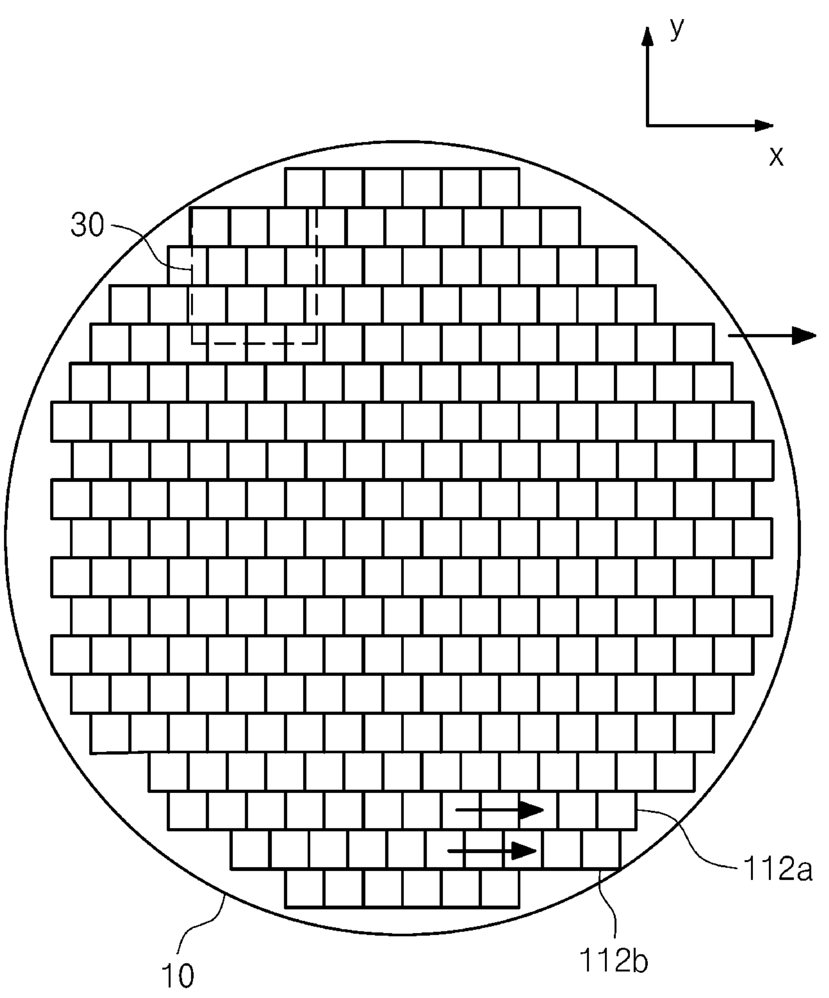
FIG. 6 is a conceptual diagram illustrating a stitching process according to an example embodiment of the present disclosure.

FIG. 6 is a conceptual diagram illustrating a stitching process according to an example embodiment of the present disclosure.

Figure 7:
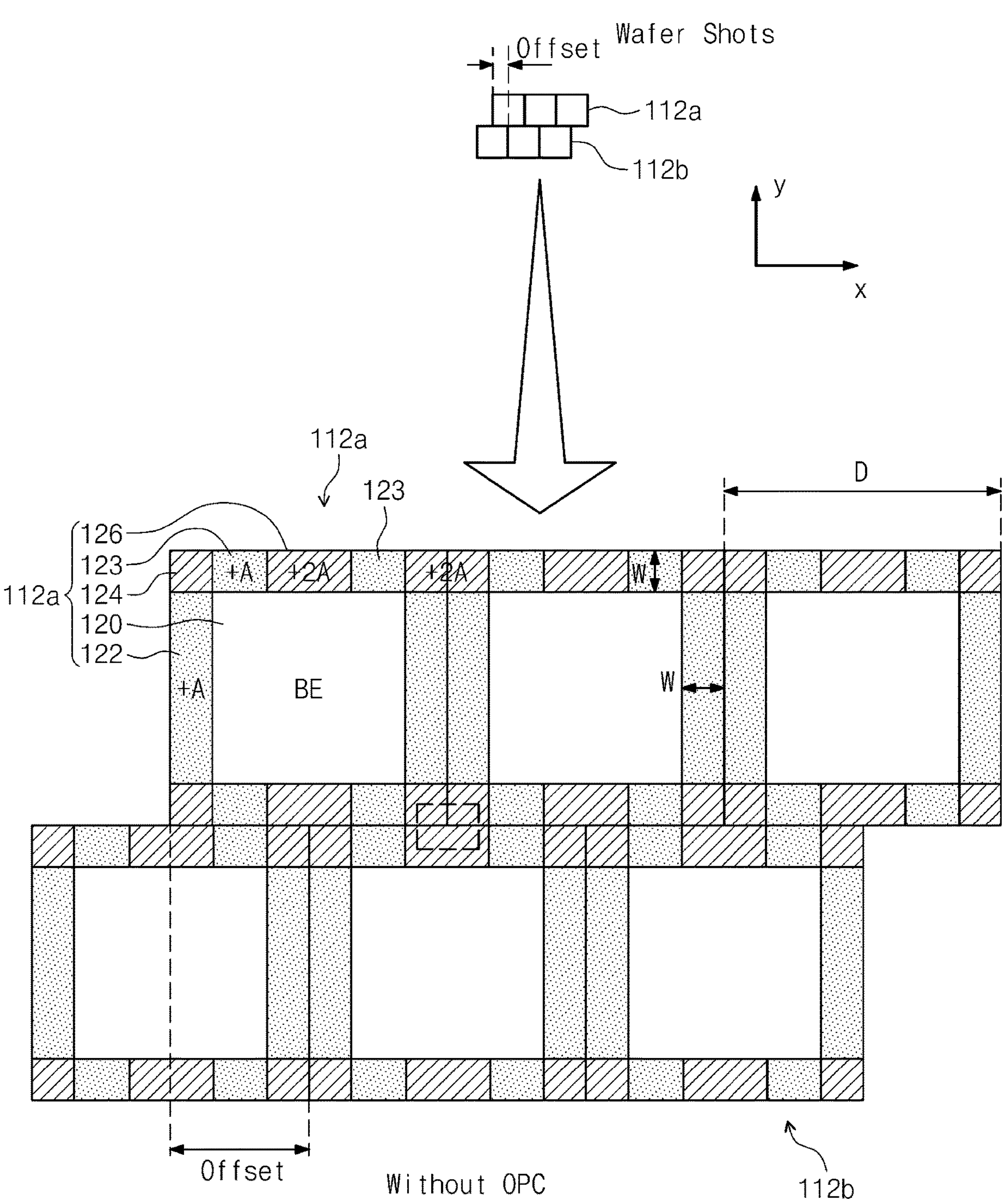
FIG. 7 is an enlarged view illustrating the stitching process of FIG. 6.

FIG. 7 is an enlarged view illustrating the stitching process of FIG. 6.

Figure 8:
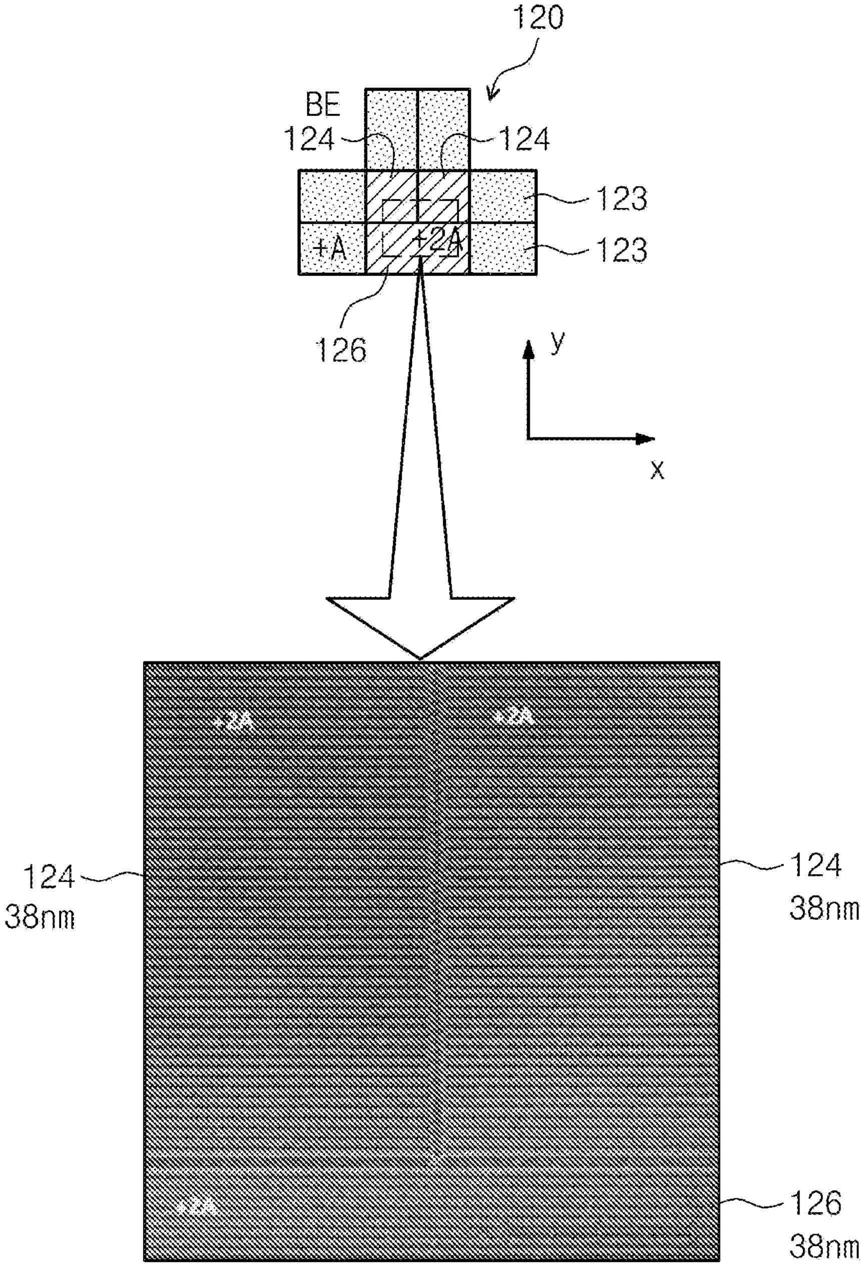
FIG. 8 is an electron microscope image illustrating shots of FIG. 6.

FIG. 8 is an electron microscope image illustrating shots of FIG. 6.

Referring to FIGS. 6 to 8, in a method of forming a line and space pattern, a mask may be exposed to a substrate in a first direction (an X-axis direction) and a second direction (a Y-axis direction) to perform a stitching process to form a line and space pattern. The method of forming line and space pattern may include performing a first exposure process on the substrate such that first shots 112*a* of the mask contact each other in the first direction; and performing a second exposure process on the substrate such that second shots 112*b* of the mask contact each other to be spaced apart from the first shots 112*b* in the second directions and have an offset with the first shots 112*b*.

The first shots 112*a* and the second shots 112*b* may sequentially expose the substrate 10. The exposure device may be an ArF scanner or an ArF stepper.

The substrate 10 may be a semiconductor substrate or a glass substrate. The photoresist (not illustrated) coated on the substrate 10 may be a positive photoresist or a negative photoresist. After the stitching exposure process, a baking process and a developing process may be performed. After forming the lines and spaces patterns of the photoresist, a conductive layer may be etched using the lines and spaces patterns of the photoresist as an etch mask to form a wire grid. The substrate 10 may be cut to have a size larger than a size of the shot to provide a metal wire grid polarizer 30.

A mask (not illustrated) may have the same pitch and the same line width in all areas. The exposure device may expose a mask (not illustrated) at a magnification of 1:1.

An offset between the first shots 112*a* and the second shots 112*b* may be greater than a width W of an interference area. The offset is greater than the width W of the interference area. The width W of the interference area may be about 10 um. The offset of the second shot 112*b* may be, in detail, half (D/2) of the size of the first shot in the first direction.

Each of the first shots and the second shots may include a reference energy area 120 exposed to reference energy; one-time interference areas 122 and 123 exposed to energy “BE+A” higher than the reference energy “BE” by the interference of the first shots and the second shots; and two interference areas 124 and 126 exposed to energy “BE+2A” higher than the reference energy by interference of the first shots and the second shots. As a result of identifying the degree of interference between the one-time interference areas 122 and 123 and the two-times interference areas 124 and 126, an amount “A” of the one-time interference may be about 20 to 30% of “BE.”

In the line and space pattern, a line width of a line may be 50 nm in the reference energy area 120. The reference energy may be expose energy set to pattern a line width of a mask to a desired line width of a photoresist. The reference energy may be determined by a pitch of the mask.

Referring to FIG. 8, a mask on which optical proximity correction was not performed is used. A pitch of the mask is 100 nm, and a line width of the mask is 50 nm. A line width of photoresist in a reference energy area 120 may be about 50 nm. A line width of photoresist in each of one-time interference areas 122 and 123 may be about 40 nm. A line width of photoresist in each of two-times interference areas 124 and 126 may be about 38 nm.

A pitch of the line and space pattern is the same in the first shots 112*a* and the second shots 112*b*, and the line width of the line and space pattern may be 38 nm to 50 nm depending on an interference area.

Accordingly, characteristics of the polarizer may be changed as a line width varies depending on an interference area at the same pitch. As a result, optical proximity correction (OPC) for the mask is required to provide substantially the same line width in all interference areas.

The first optical proximity correction on the one-time interference areas 122 and 123 may increase a line width of a mask by a first variance while having the same pitch. The second optical proximity correction on the two-time interference areas 124 and 126 may increase a line width of a line by a second variance while having the same pitch. The second variance may be greater than the first variance, and the first variance may be proportional to a difference “A” between expose energy of the one-time interference area and basic expose energy of an interference-free area. The difference between the expose energy of the one-time interference area and the basic expose energy of the interference-free area is an amount “A” of one-time interference, which is about 20 to 30% of “BE.”

Figure 9:
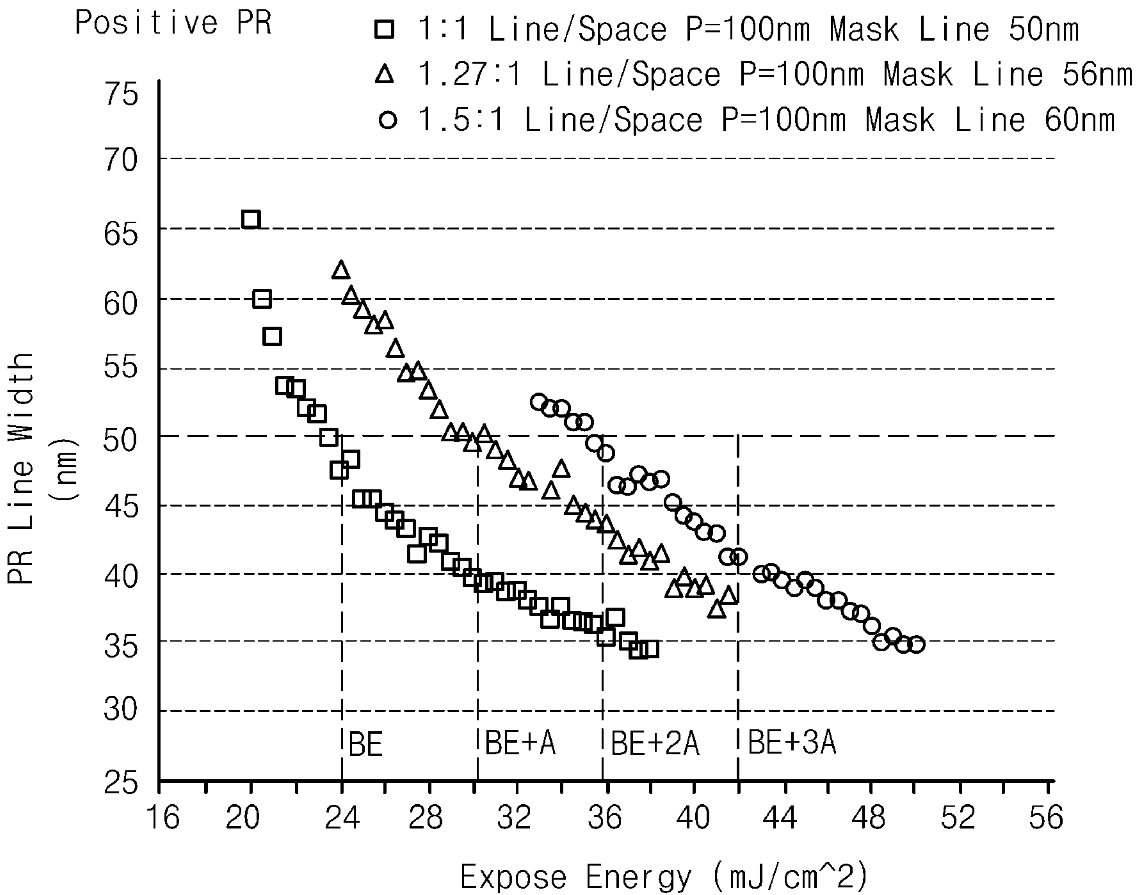
FIG. 9 is an experimental result illustrating a line width of a photoresist depending on expose energy depending on line width of a mask at the same pitch according to an example embodiment of the present disclosure.

FIG. 9 is an experimental result illustrating a line width of a photoresist depending on expose energy depending on line width of a mask at the same pitch according to an example embodiment of the present disclosure.

Referring to FIG. 9, the photoresist is a positive photoresist. A pitch of the mask is 100 nm, and line widths of lines are 50 nm, 56 nm, or 60 nm, respectively. In an exposure process, exposure was performed at a magnification of 1:1 through an ArF immersion scanner process.

When a line width of the mask is 50 nm (rectangular), after the exposure and development process, a line width of the photoresist is displayed according to the expose energy.

When a line width of the mask is 56 nm (triangle), after the exposure and development process, a line width of the photoresist is displayed according to the expose energy.

When a line width of the mask is 60 nm (circular), after the exposure and development process, a line width of the photoresist is displayed according to the expose energy.

When a line width of the mask is 50 nm (rectangular), the reference expose energy "BE" for obtaining a photoresist having a line width of 50 nm is about 24 mJ/cm^2.

The one-time interference area is exposed to energy "BE+A" higher than the reference energy "BE." Accordingly, the expose energy "BE+A" of the one-time interference area is 30 mJ/cm^2, and the line width of the photoresist is 50 nm when the line width of the mask is 56 nm (triangle).

The two-times interference area is exposed to energy "BE+2A" higher than the reference energy "BE." Accordingly, the expose energy "BE+2A" of the two-times interference area is 36 mJ/cm^2, and the line width of the photoresist is 50 nm when the line width of the mask is 60 nm (circular).

Consequently, the optical proximity correction may be set such that the line width of the mask is 56 nm to allow the line width of the one-time interference area to be maintained at 50 nm. The optical proximity correction may be set such that the line width of the mask is 60 nm to allow the line width of the two-times interference area to be maintained at 50 nm.

Returning to FIGS. 5 and 9, for mask line widths of 40 nm and 44 nm in FIG. 5, reference energy is 23 mJ/cm^2. When the expose energy is about 34 mJ/cm^2 or more, the photoresist pattern may not be formed. Since the two-times interference area has an energy of 35 mJ/cm^2(23+2×6), a photoresist pattern may not be formed.

However, referring to FIGS. 5 and 9, when the line width of the mask is increased at the same pitch through optical proximity correction of the mask, the line width of the photoresist depending on the expose energy may be moved to an upper right portion. For example, for a mask line width of 44 nm (a pitch of 88 nm), a photoresist pattern may be formed by performing optical proximity correction at the mask line width of 50 nm (the pitch of 88 nm) through optical proximity correction of the mask on the two-times interference area.

Referring to FIGS. 5 and 9, for example, when a mask line width of 40 nm (a pitch of 80 nm) is corrected into a mask line width of 42 nm (a patch of 80 nm) through optical mask correction of the mask on the two-times interference area, photoresist patterning may be performed.

According to a modified embodiment of the present disclosure, in a stitching process having an offset, proximity optical correction may be performed on only one of a one-time interference area and a two-times interference area. The proximity optical correction may be performed on, in detail, only the two times interference area.

Figure 10A:
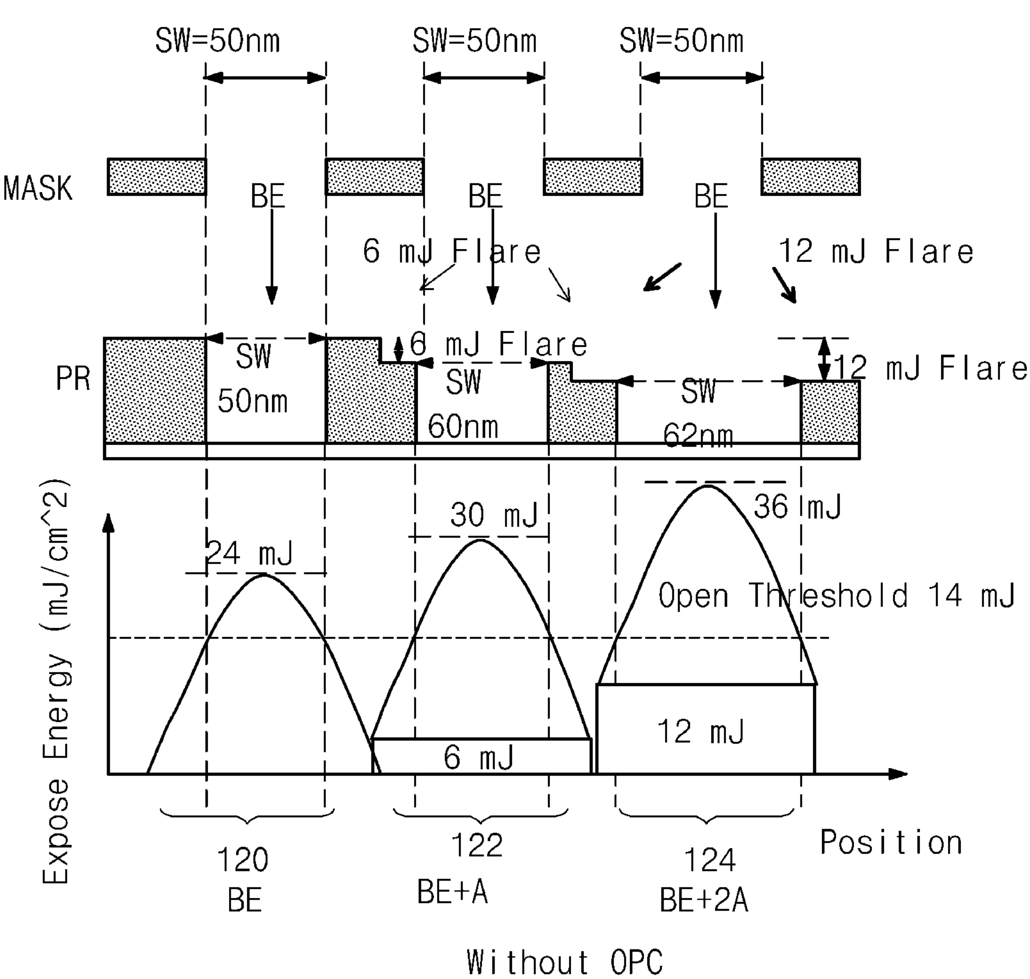
FIG. 10A is a conceptual diagram illustrating characteristics of a mask having no OPC and a resist for each area according to an example embodiment of the present disclosure.

FIG. 10A is a conceptual diagram illustrating characteristics of a mask having no OPC and a resist for each area according to an example embodiment of the present disclosure.

Figure 10B:
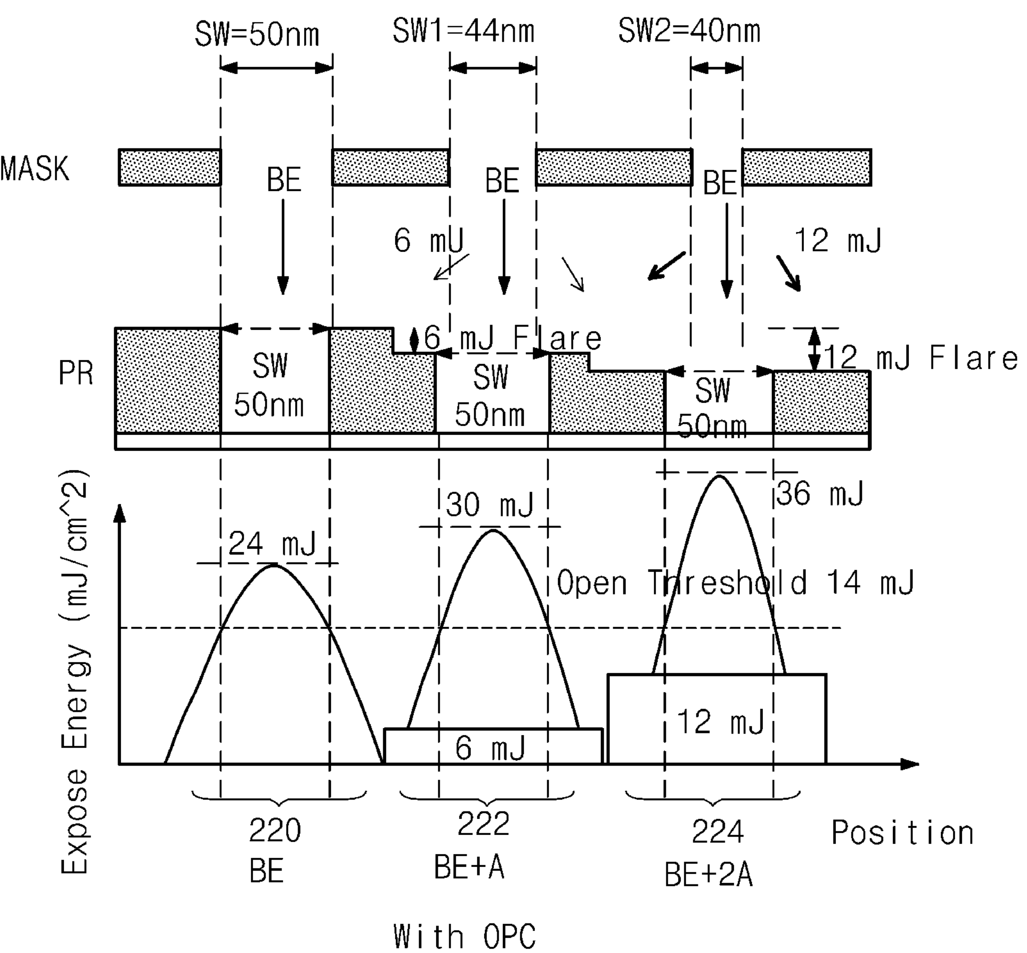
FIG. 10B is a conceptual diagram illustrating characteristics of a mask having OPC and a resist for each area according to an example embodiment of the present disclosure.

FIG. 10B is a conceptual diagram illustrating characteristics of a mask having OPC and a resist for each area according to an example embodiment of the present disclosure.

Referring to FIG. 10A, when a mask having no OPC has a pitch P of 100 nm, a line width of the mask is 50 nm and a space width of the mask is 50 nm.

A reference energy area 120 of photoresist has expose energy of "BE" (about 24 mJ/cm^2). One-time interference areas 122 and 123 of the photoresist have expose energy of "BE+A" (about 30 mJ/cm^2). Two-times interference areas 124 and 126 of the photoresist have expose energy of "BE+2A" (about 36 mJ/cm^2). In the one-time interference areas 122 and 123, a height of the photoresist may decrease due to flare interference of 6 mJ. The two-times interference areas 124 and 126 of the photoresist may decrease in heigh due to flare interference of 12 mJ.

When it is assumed that a three-times interference area is present, the height of the photoresist is further reduced by the flare interference of 18 mJ. Accordingly, in the stitching process having the three-time interference area, a limited lower etching process may not be performed due to a low thickness of the photoresist.

However, in the present disclosure. the three-times interference area may be removed. In the present disclosure, there are only a one-time interference area and a two-times interference area. The stitching process of the present disclosure may suppress a decrease in thickness of photoresist to stably perform a subsequent etching process.

Referring to FIG. 10B, when a mask having OPC has a pitch P of 100 nm, a line width of the mask is 50 nm, 56 nm, and 60 nm for respective interference areas and a space width of the mask is 50 nm, 44 nm, and 40 nm for the respective interference areas.

A reference energy mask area 311 may have a basic mask line width LW. The one-time interference mask areas 312*a*, 312*b*, 316*a*, 316*b*, 317*a*, and 317*b* have the first mask line width LW1. Two-times interference mask areas 313*a*, 313*b*, 314*a*, 314*b*, 315*a*, and 315*b* may have a second mask line width LW2. The second mask line width LW2 may be greater than the first mask line width LW1, and the first mask line width LW1 may be greater than the basic mask line width LW. The one-time interference mask areas 312*a*, 312*b*, 316*a*, 316*b*, 317*a*, and 317*b* may increase a line width of a chromium pattern to reduce an expose energy profile. Accordingly, a line width of photoresist may be increased.

That is, a basic mask space width (SW=P−LW) of the reference energy mask area 311 is 50 nm. A first mask space width (SW1=P−LW1) of the one-time interference mask areas 312*a*, 312*b*, 316*a*, 316*b*, 317*a*, and 317*b* is 44 nm. A second mask space width (SW2=P−LW2) of the two-times interference mask areas 313*a*, 313*b*, 314*a*, 314*b*, 315*a*, and 315*b* is 40 nm. Due to the decreased space width, the space width of the photoresist may be increased to be maintained at 50 nm. That is, the line width of the photoresist may be increased to be maintained at 50 nm due to the decreased space width.

The reference energy area 220 of the photoresist may have expose energy of "BE" (about 24 mJ/cm^2). The one-time interference areas 222 and 223 of the photoresist may have expose energy of "BE+A" (about 30 mJ/cm^2), but may have a narrowed energy profile. The two-times interference areas 224 and 226 of the photoresist have expose energy of "BE+2A" (about 36 mJ/cm^2), but may have a narrowed energy profile. The space width of the photoresist may be decreased by the narrowed energy profile.

Accordingly, both the one-time interference areas 222 and 223 of the photoresist and the two-times interference areas 224 and 226 of the photoresist have the same line width of 50 nm. As a result, the metal wire grid polarizer may provide stable characteristics.

Figure 11A:
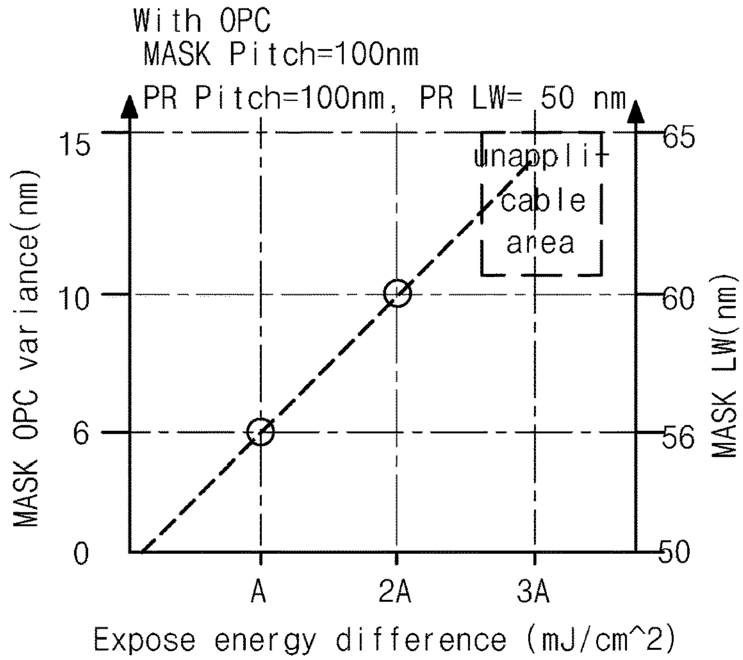
FIG. 11A illustrates a variance of optical proximity correction of a mask depending on a difference in expose energy at a mask pitch of 100 nm in an example embodiment of the present disclosure.

FIG. 11A illustrates a variance of optical proximity correction of a mask depending on a difference in expose energy at a mask pitch of 100 nm in an example embodiment of the present disclosure.

Referring to FIG. 11A, to obtain 50 nm, the same line width of the photoresist, in all interference areas, a variance of optical proximity correction of a mask depending on a difference in expose energy is illustrated. An amount of interference caused by one-time interference is "A," an amount of interference caused by two-times interference is "2A," and an amount of interference caused by three-times interference is "3A." A line width of the mask may be corrected from 50 nm to 56 nm to perform optical proximity correction on the amount of interference "A" caused by one-time interference. The line width of the mask may be corrected from 50 nm to 60 nm to perform optical proximity correction on the interference amount "2A" caused by the two-times interference.

The line width of the mask may be corrected from 50 nm to about 65 nm to perform optical proximity correction on the amount of interference "3A" caused by three-times interference. However, when the line width of the mask is 65 nm, the line width of the space is 35 nm ((100-65) nm). In this case, the ArF exposure device cannot form a pattern due to limitation thereof. Accordingly, such conditions cannot be accomplished. Although the line width of the mask was corrected to 62 nm (a limitation of an ArF immersion device) and an exposure test may be performed on the three-times interference area, a height of the photoresist was significantly reduced and a line width thereof did not approach 40 nm and collapsed.

Figure 11B:
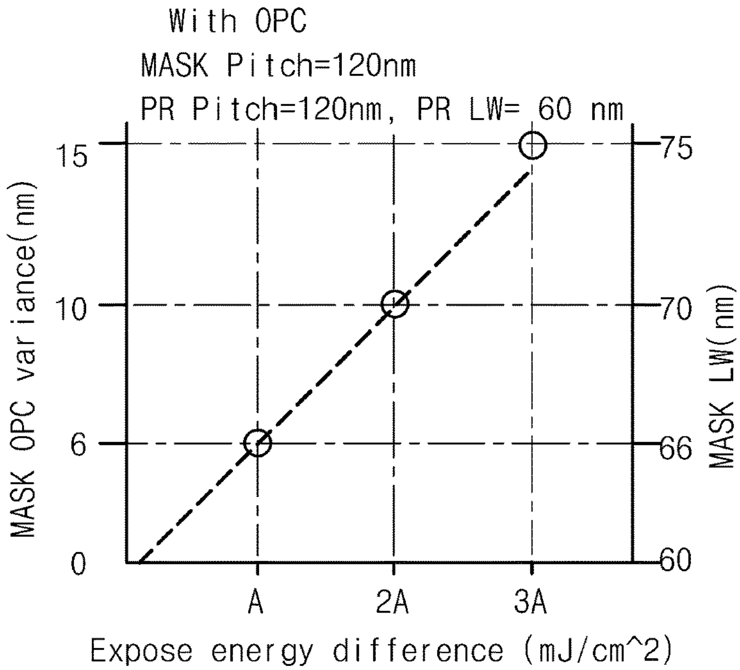
FIG. 11B illustrates a variance of optical proximity correction of a mask depending on a difference in expose energy at a mask pitch of 120 nm in an example embodiment of the present disclosure.

FIG. 11B illustrates a variance of optical proximity correction of a mask depending on a difference in expose energy at a mask pitch of 120 nm in an example embodiment of the present disclosure.

Referring to FIG. 11B, to obtain 60 nm that is the same line width the photoresist in all interference areas, a variance of optical proximity correction of the mask depending on a difference in expose energy is illustrated. An amount of interference caused by one-time interference is "A," an amount of interference caused by two-times interference is "2A," and an amount of interference caused by three-times interference is "3A." For optical proximity correction of the amount of interference "A" caused by one-time interference, the line width of the mask may be corrected from 60 nm to 66 nm. For optical proximity correction of the amount of interference "2A" caused by the two-times interference, the line width of the mask may be corrected from 60 nm to 70 nm.

For optical proximity correction of the amount of interference "3A" caused by three-times interference, the line width of the mask may be corrected from 60 nm to 75 nm. However, when the line width of the mask is 75 nm, a line width of a space is 45 nm ((120-75) nm). The ArF exposure device may form a photoresist pattern at a mask line width of 75 nm, but a height of the photoresist pattern may be significantly reduced. Therefore, it may be difficult to perform a subsequent etching process. A difference in height of the photoresist may cause transmittance performance of a wire grid polarizer to be deteriorated in the future.

Figure 12:
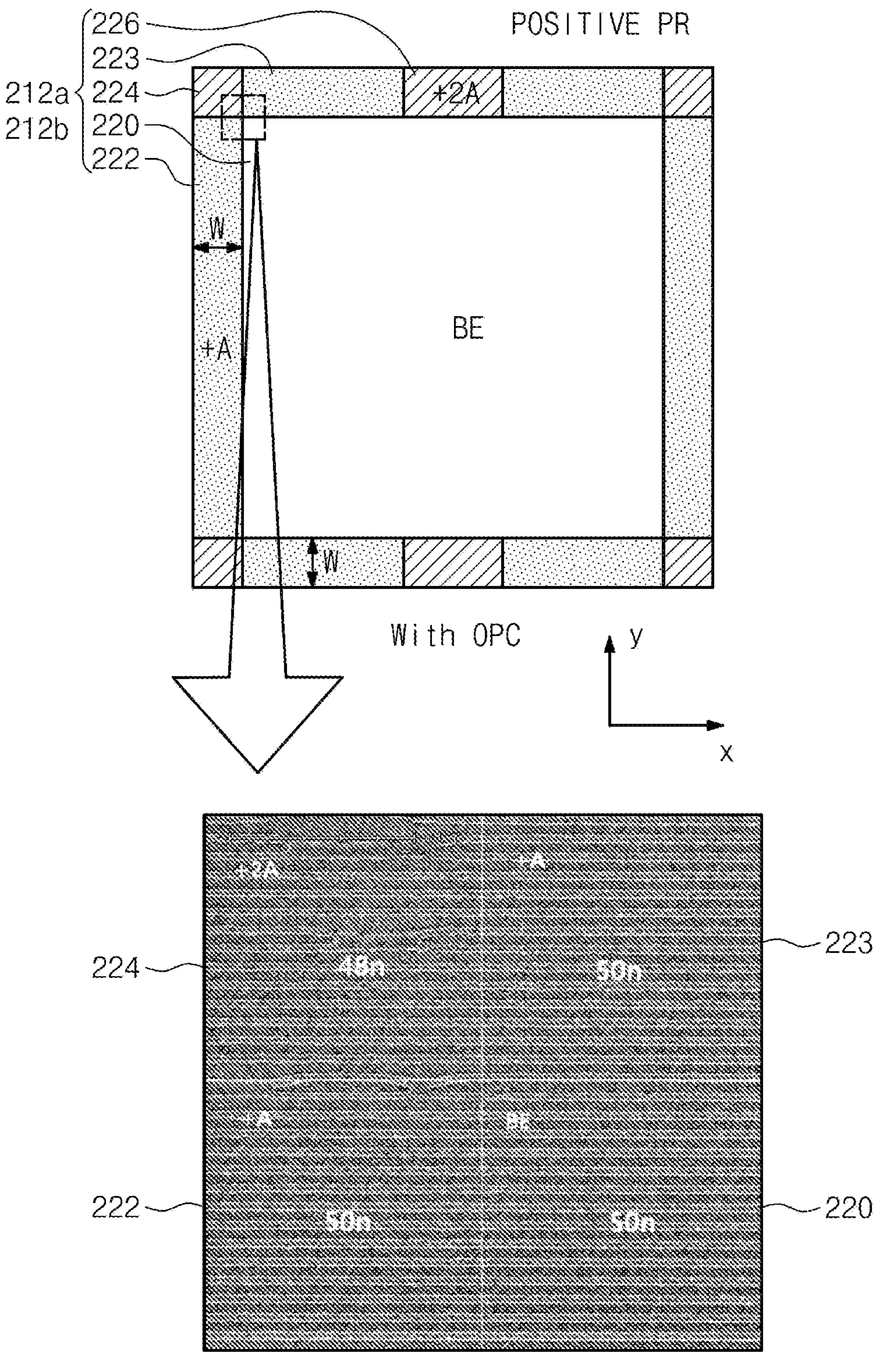
FIG. 12 is an electron microscope image illustrating a shot of a photoresist using a mask on which optical proximity correction is performed according to an example embodiment of the present disclosure.

FIG. 12 is an electron microscope image illustrating a shot of a photoresist using a mask on which optical proximity correction is performed according to an example embodiment of the present disclosure.

Referring to FIG. 12, when a stitching process having an offset is performed using a mask on which optical proximity correction has been performed, the reference energy area 220 of each of the first shot 212*a* and the second shot 212*b* may have expose energy of "BE" (about 24 mJ/cm^2). The one-time interference areas 222 and 223 have expose energy of "BE+A" (about 30 mJ/cm^2). The two-times interference areas 224 and 226 have expose energy of "BE+2A" (about 36 mJ/cm^2).

The reference energy area 220 may have a shape of a rectangle disposed within a rectangular shot and may be disposed in a center of shots, the one-time interference area 222 and 223 may be disposed on sides to surround the reference energy area, and the two-times interference areas 224 and 226 may be locally disposed between vertices of the reference energy area and a pair of vertices in a first direction.

A case will be described, where a magnification of a mask and a photoresist pattern is 1. The one-time interference mask area of the mask corresponding to the one-time interference area may have a first mask line width, greater than a basic mask line width of a reference energy mask area of the mask corresponding to the reference energy area.

A two-times interference mask area of the mask corresponding to the two-times interference area may have a second mask line width, greater than a mask line width of a reference energy mask area of the mask corresponding to the reference energy area.

Accordingly, in the one-time interference area, the line width of the corresponding mask may be increased to 56 nm to obtain the photoresist having a width of 50 nm. On the other hand, in the two-times interference area, the line width of the corresponding mask may be increased to 60 nm to obtain the photoresist having a line width of 50 nm According to an experimental result of the present disclosure, the line width of the reference energy area 220 is 50 nm, the line width of the one-time interference areas 222 and 223 is 50 nm, and the line width of the two-times interference area 224 and 226 is 48 nm. Accordingly, the two-times interference areas 224 and 226 may be within a margin of error while having a difference of 2 nm from the target value of 50 nm. As a result, optical proximity correction may form uniform line and spacer patterns that do not depend on interference of shots.

According to a modified embodiment of the present disclosure, the line and space pattern may have the same pitch in the first shots 212*as* and the second shots 212*b*, and may have a line width of 38 nm to 50 nm.

An experiment of the present disclosure was performed using an ArF immersion exposure device, but may be equally applied to an EUV exposure device.

Figure 13:
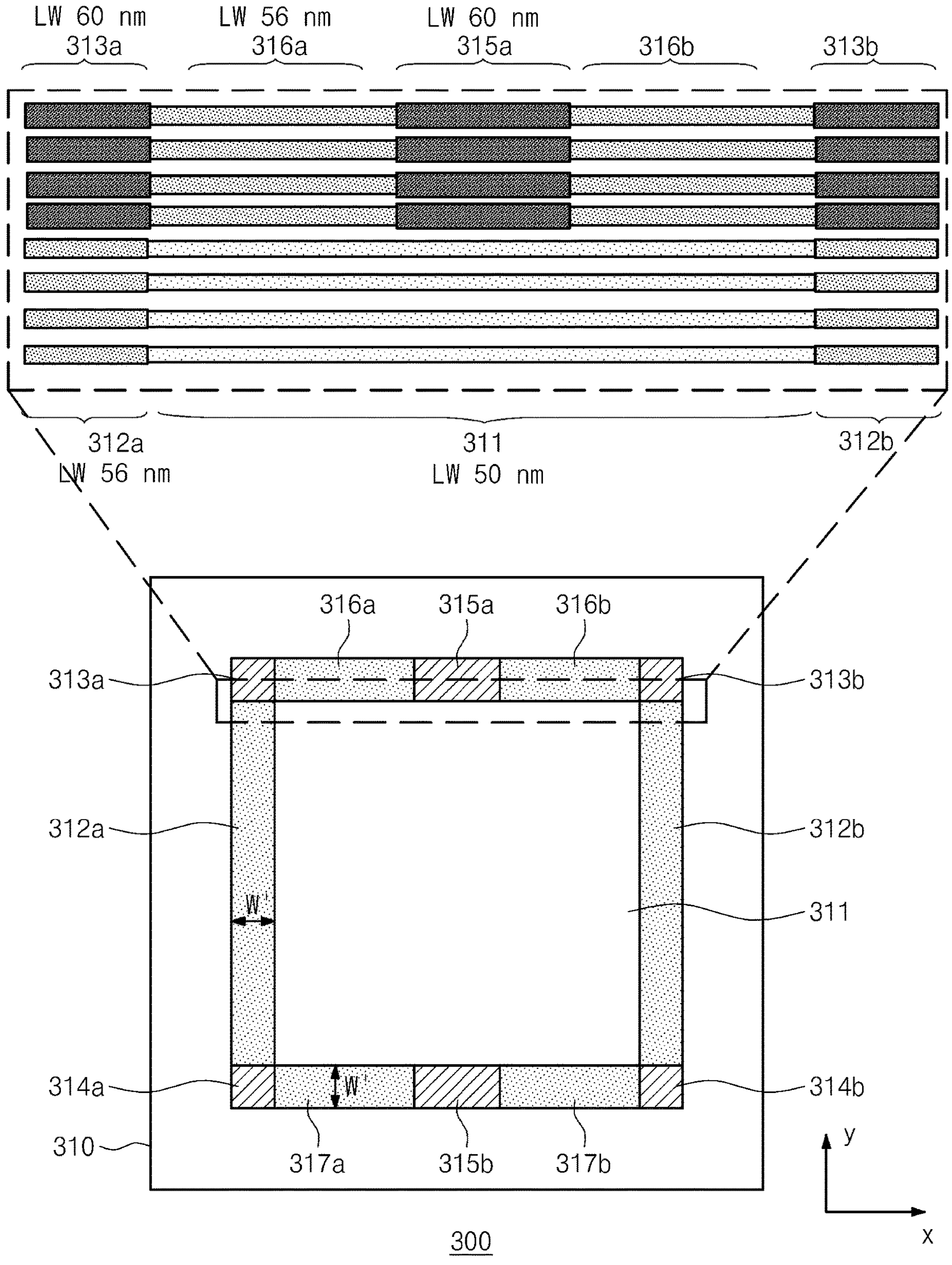
FIG. 13 is a conceptual diagram illustrating a mask on which optical proximity correction is performed according to an example embodiment of the present disclosure.

FIG. 13 is a conceptual diagram illustrating a mask on which optical proximity correction is performed according to an example embodiment of the present disclosure.

Referring to FIG. 13, a mask 314 on which optical proximity correction has been performed may include a rectangular reference energy mask area 311 formed on a mask substrate 310 in the first direction and the second direction; one-time interference mask areas 312*a*, 312*b*, 316*a*, 316*b*, 317*a*, and 317*b* disposed on sides to surround the reference energy mask area 311; and two-times interference mask areas 313*a*, 313*b*, 314*a*, 314*b*, 315*a*, and 315*b* locally disposed between vertices of the reference energy mask area and a pair of vertices in the first direction. A width W' of each of the one-time interference mask areas 312*a*, 312*b*, 316*a*, 316*b*, 317*a*, and 317*b* may correspond to a width W of an interference area of a shot.

The reference energy mask area 311 may have a basic mask line width. Each of the one-time interference mask areas 312*a*, 312*b*, 316*a*, 316*b*, 317*a*, and 317*b* may have a first mask line width. Each of the two-times interference mask areas 313*a*, 313*b*, 314*a*, 314*b*, 315*a*, and 315*b* may have a second mask line width. The second mask line width may be greater than the first mask line width, and the first mask line width may be greater than the basic mask line width. The one-time interference mask areas 312*a*, 312*b*,

316*a*, 316*b*, 317*a*, and 317*b* may increase a line width of a chromium pattern to reduce an expose energy profile. Accordingly, a line width of photoresist may be increased.

The mask 314 on which optical proximity correction has been performed may include a rectangular reference energy mask area 311; a left area 312*a* and a right area 312*b*, respectively disposed on the left and right sides of the reference energy mask area 311; an upper left vertex area 313*a* and an upper right vertex area 313*b*, respectively disposed in an upper left portion and an upper right portion of the reference energy mask area 311; an lower left vertex area 314*a* and an lower left vertex area 314*b*, respectively disposed in a lower left portion and a lower right portion of the reference energy mask area 311; an upper area 315*a* disposed above the reference energy mask area 311; an upper left area disposed between the upper area 315*a* and the upper left vertex area 313*a*; an upper right area 316*b* disposed between the upper area 315*a* and the upper right vertex area 313*b*; a lower area 315*b* disposed below the reference energy mask area 311; a lower left area 317*a* disposed between the lower area 315*b* and the lower left vertex area 314*a*; and an lower right area 317*b* disposed between the lower area 315*b* and the lower left vertex area 314*b*.

A line width of the reference energy mask area 311 is a basic mask line width. Line widths of the left area 312*a*, the right area 312*b*, the upper left area 316*a*, the upper right area 316*b*, the lower left area 317*a*, and lower right area 317*b* are the same as a first mask line width. Line widths of the upper area 315*a*, the lower area 315*b*, the upper left vertex area 313*a*, the upper right vertex area 313*b*, the lower left vertex area 314*a*, and the lower right vertex area 314*b* are the same as a second mask line width. The second mask line width is greater than the first mask line width, and the first mask line width is greater than the basic mask line width.

When the magnification of the mask pattern and the photoresist pattern is 1:1, the basic mask line width may be 50 nm, the first mask line width may be 56 nm, and the second mask line width may be 60 nm.

When the magnification of the mask pattern and the photoresist pattern is 4:1, the basic mask line width may be 50×4 nm, the first mask line width may be 56×4 nm, and the second mask line width may be 60×4 nm.

Figure 14:
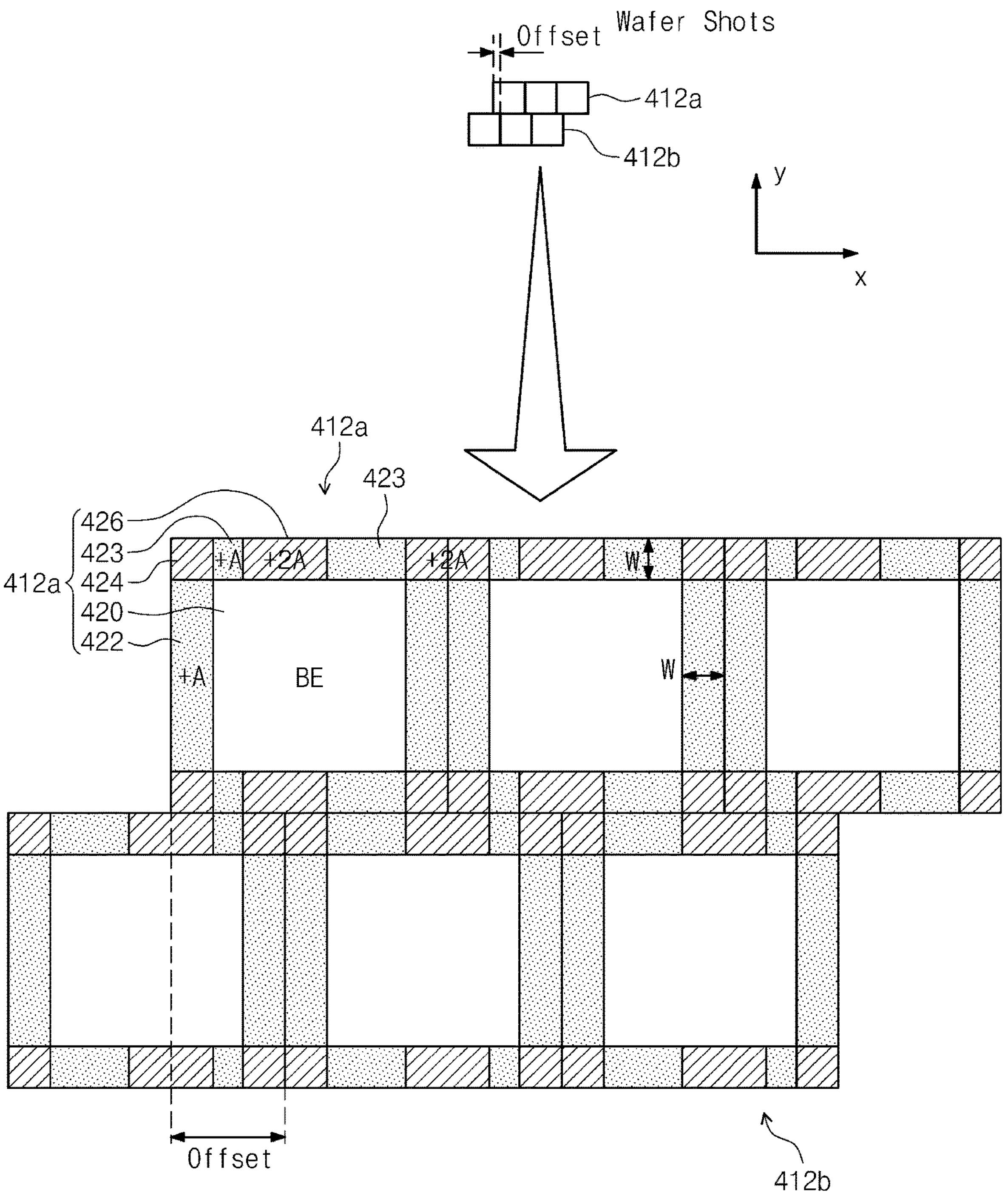
FIG. 14 is an enlarged view illustrating a stitching process according to another embodiment of the present disclosure.

FIG. 14 is an enlarged view illustrating a stitching process according to another embodiment of the present disclosure.

Figure 15:
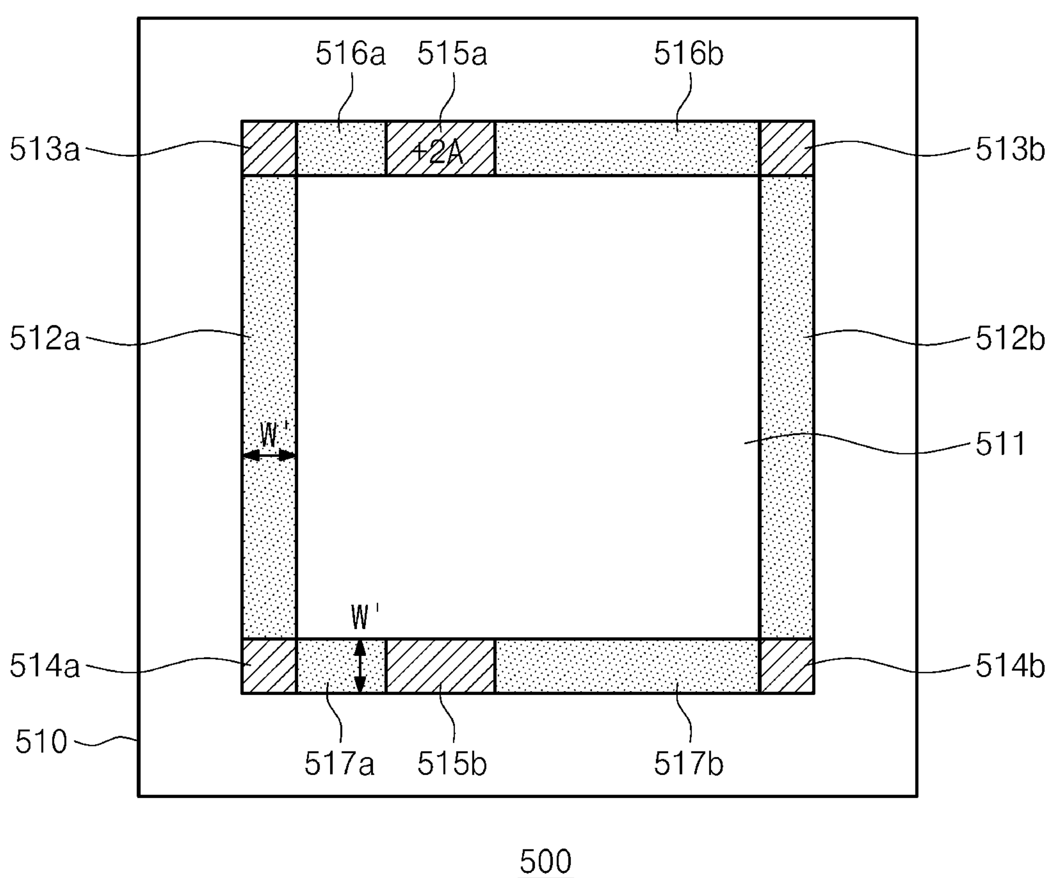
FIG. 15 is a view illustrating a mask on which a stitching process is performed according to another embodiment of the present disclosure.

FIG. 15 is a view illustrating a mask on which a stitching process is performed according to another embodiment of the present disclosure.

FIGS. 14 and 15 illustrate a result obtained by performing a stitching process using a mask on which optical proximity correction has been performed. In a method of forming a line and space pattern, a stitching process is performed by exposing a mask 500 to a substrate in a first direction and a second direction. The method of forming the line and space pattern may include performing a first exposure process on the substrate such that first shots 412*a* of the mask contact each other in the first direction; and performing a second exposure process on the substrate such that the second shots 412*b* of the mask contact each other to be spaced apart from the first shots 412*a* in the second direction and have an offset in the first direction. The offset may be greater than a width W of the interference area of the shots.

Each of the first shots 412*a* and the second shots 412*b* may include a reference energy area 420 exposed to reference energy; one-time interference areas 422 and 423 having energy higher than the reference energy due to interference of the first shots and the second shots; and two-times interference areas 424 and 426 having energy higher than the reference energy due to interference of the first shots and the second shots.

Each of the one-time interference mask areas 512*a*, 512*b*, 516*a*, 516*b*, 517*a*, and 517*b* of the mask 500, corresponding to the one-time interference areas 422 and 423, may have a first mask line width, greater than the basic mask line width of the reference energy mask area 511 corresponding to the reference energy area 420.

Each of the two-times interference mask areas 513*a*, 513*b*, 514*a*, 514*b*, 515*a*, and 515*b* of the mask 500, corresponding to the two-times interference areas 424 and 426 may have a second mask line width, greater than a mask line width of a reference energy area of the mask corresponding to the reference energy area.

A pitch of the line and space pattern may be the same in the first shots 412*a* and the second shots 412*b*, and a line width of the line and space pattern may be 38 nm to 50 nm.

The reference energy area 420 may have a shape of a rectangle disposed within a rectangular shot and may be disposed in a center of shots. The one-time interference areas 422 and 423 may be disposed on sides to surround the reference energy area.

The two-times interference areas 424 and 426 may be locally disposed between vertices of the reference energy area 420 and a pair of vertices in the first direction.

The mask 500 includes a rectangular reference energy mask area 511; a left area 512*a* and a right area 512*b*, respectively disposed on a left side and a right side of the reference energy mask area; an upper left vertex area 513*a* and an upper right vertex area 513*b*, respectively disposed in an upper left portion and an upper right portion of the reference energy mask area 511; a lower left vertex area 514*a* and a lower right vertex area 514*b*, respectively disposed in a lower left portion and a lower right portion of the reference energy mask area 511; an upper area 515*a* disposed above the reference energy mask area 511; an upper left area 516*a* disposed between the upper area 515*a* and the upper left vertex area 513*a*; an upper right area 516*b* disposed between the upper area 515*a* and the upper right vertex area 513*b*; a lower area 515*b* disposed below the reference energy mask area 511; a lower left area 517*a* disposed between the lower area 515*b* and the lower left vertex area 514*a*; and a lower right area 517*a* disposed between the lower area 515*b* and the lower right vertex area 514*b*.

A line width of the reference energy mask area 511 is the basic mask line width. Line widths of the left area 512*a*, the right area 512*b*, the upper left area 516*a*, the upper right area 516*b*, the lower left area 517*a*, and the lower right area 517*b* are the same as a first mask line width. Line widths of the upper area 515*a*, the lower area 515*b*, the upper left vertex area 513*a*, the upper right vertex area 513*b*, the lower left vertex area 514*a*, and the lower right vertex area 514*b* are the same as a second mask line width. The second mask line width may be greater than the first mask line width, and the first mask line width may be greater than the basic mask line width.

When a magnification of the mask and the photoresist pattern is 1:1, the basic mask line width may be 50 nm, the first mask line width may be 56 nm, and the second mask line width may be 60 nm.

Figure 16:
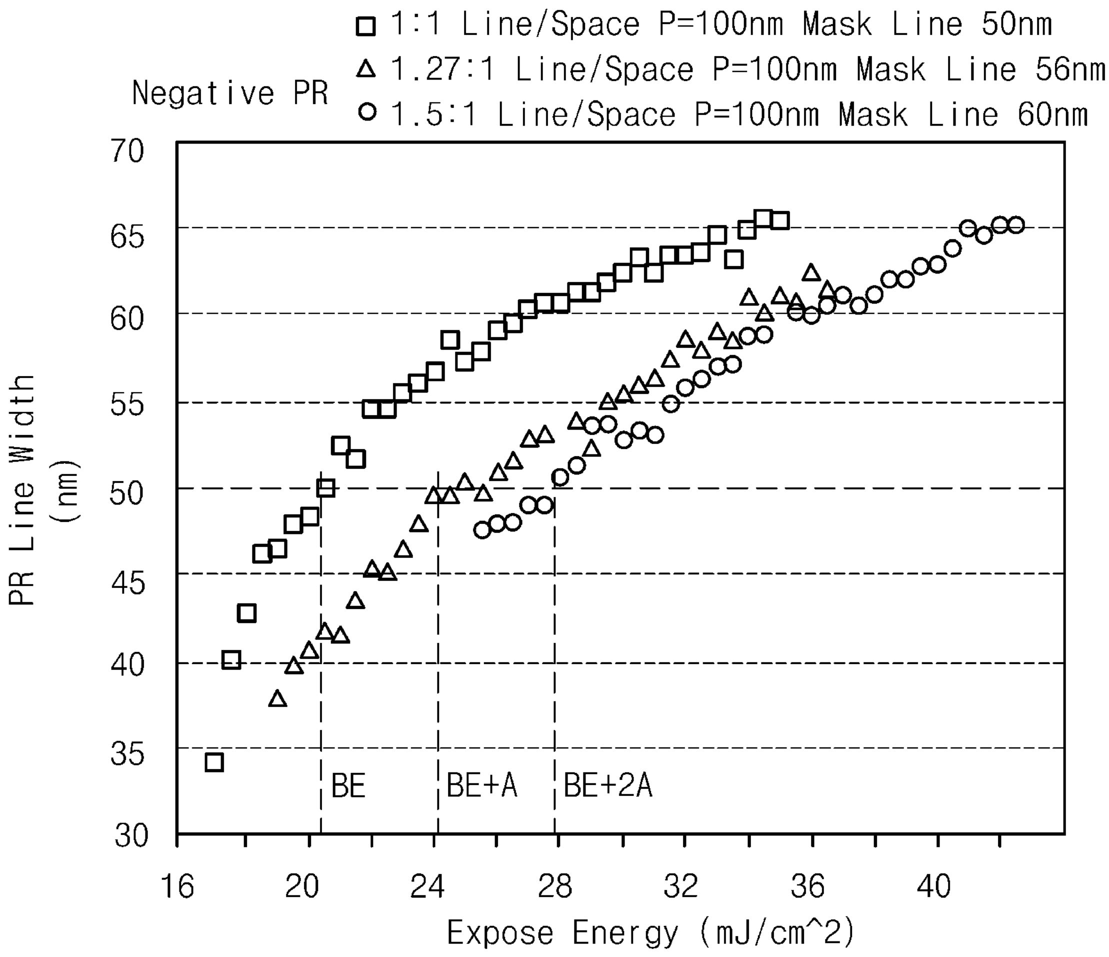
FIG. 16 shows a line width of a negative photoresist according to another embodiment of the present disclosure.

FIG. 16 shows a line width of a negative photoresist according to another embodiment of the present disclosure.

Referring to FIG. 16, photoresist is negative photoresist. A pitch of a mask may be 100 nm, and a line width of a line may be 50 nm, 56 nm, or 60 nm. In the exposure process, exposure was performed at a magnification of 1:1 through an ArF immersion scanner process When the line width of the mask is 50 nm (rectangles), a line width of photoresist is displayed based on expose energy after an exposure and development process.

When the line width of the mask is 56 nm (triangles), a line width of photoresist is displayed based on expose energy after an exposure and development process.

When the line width of the mask is 60 nm (circles), a line width of photoresist is displayed based on expose energy after an exposure and development process.

When the line width of the mask is 50 nm (rectangles), reference expose energy “BE” for obtaining a photoresist line width of 50 nm may be about 20 mJ/cm^2.

The one-time interference area may be exposed to energy “BE+A,” higher than the reference energy “BE.” Accordingly, the expose energy “BE+A” of the interference area may be 24 mJ/cm^2, and when the line width of the mask is 56 nm (triangles), the line width of the photoresist may be 50 nm.

The two-times interference area may be exposed to energy “BE+2A,” higher than the reference energy “BE.” Accordingly, the expose energy “BE+2A” of the two-times interference area may be 28 mJ/cm^2, and when the line width of the mask is 60 nm (circles), the line width of the photoresist may be 50 nm.

As a result, the optical proximity correction may be set such that the line width of the mask has 56 nm to allow the line width of the one-time interference area to be maintained at 50 nm. The optical proximity correction may be set such that the line width of the mask has 60 nm to allow the line width of the two-times interference area to be maintained at 50 nm.

FIG. 17 is a flowchart illustrating a method of manufacturing a mask for forming a line and space pattern.

Referring to FIG. 17, a method of manufacturing a mask for forming a line and space pattern, exposing a first mask for forming a line and space pattern on a substrate in a first direction and a second direction to perform a first stitching process (S110); measuring expose energy or line width of an one-time interference area having energy higher than reference energy having no interference due to one-time interference of shots through the first stitching process (S120); measuring expose energy or line width of a two-times interference area having energy higher than the reference energy due to two-times interference of shots through the first stitching process (S130); and forming a second mask by performing first optical proximity correction to increase a line width in a one-time interference mask area of the first mask corresponding to the one-time interference area based on the expose energy or the line width of the one-time interference area and by performing second optical proximity correction to increase line width in a two-times interference mask area of the first mask corresponding to the two-times interference area based on the expose energy or the line width of the two-times interference area (S140).

The first stitching process (S110) may include performing a first exposure process on the substrate such that first shots of the first mask contact each other in the first direction; and performing a second exposure process on the substrate such that second shots of the first mask contact each other to be spaced apart from the first shots in the second direction to have an offset with the first shots.

The first optical proximity correction may have the same pitch and may increase a line width of a line by a first variance. The second optical proximity correction may have the same pitch and may increase a line width of a line by a second variance. The second variance may be greater than the first variance, and the first variance may be proportional to a difference between expose energy of the one-time interference area and basic expose energy of an interference-free area.

Then, a stitching process is performed on a second mask on which the first optical proximity correction and the second optical proximity correction have been performed.

Although the present disclosure and its advantages have been described in detail, it should be understood that various changes, substitutions and alterations can be made herein without departing from the spirit and scope of the disclosure as defined by the following claims.

The invention claimed is:

1. A method of forming a line and space pattern by exposing a mask on a substrate in a first direction and a second direction to perform a stitching process, the method comprising:

performing a first exposure process on the substrate such that first shots of the mask contact each other in the first direction; and performing a second exposure process on the substrate such that second shots of the mask contact each other to be spaced apart from the first shots in the second direction and have an offset with the first shots in the first direction, wherein:

each of the first shots and each of the second shots comprises:

a reference energy area exposed to reference energy;

a one-time interference area having energy higher than the reference energy due to interference of the first shots and the second shots; and a two-times interference area having energy higher than the reference energy due to interference of the first shots and the second shots;

a one-time interference mask area of the mask corresponding to the one-time interference area has a first mask line width greater than a basic mask line width of a reference energy mask area of the mask corresponding to the reference energy area, and a two-times energy mask area of the mask corresponding to the two-times interference area has a second mask line width greater than a mask line width of the reference energy mask area of the mask corresponding to the reference energy area.

2. The method as set forth in claim 1, wherein the offset is greater than a width of an interference area of the shots.

3. The method as set forth in claim 1, wherein a pitch of the line and space pattern is identical in the first shots and the second shots, and a pitch of photoresist of the line and space pattern is 80 nm to 140 nm.

4. The method as set forth in claim 1, wherein the reference energy area has a shape of a rectangle in a rectangular shot and is in a center of shots, the one-time interference area is on a side to surround the reference energy area, and the two-times interference area is locally disposed between vertices of a reference energy area and a pair of vertices in the first direction.

5. The method as set forth in claim 1, wherein the mask comprises:

a rectangular reference energy mask area;

a left area and a right area, respectively on left and right sides of the reference energy mask area;

an upper left vertex area and an upper right vertex area, respectively in an upper left portion and an upper right portion of the reference energy mask area;

a lower left vertex area and an upper lower vertex area, respectively in a lower left portion and a lower right portion of the reference energy mask area;

an upper area above the reference energy mask area;

an upper left area between the upper area and the upper left vertex area;

an upper right area between the upper area and the upper right vertex area;

a lower area below the reference energy mask area;

a lower left area between the lower area and the lower left vertex area; and a lower right area between the lower area and the lower left vertex area, a line width of the reference energy mask area is a basic mask line width, line widths of the left area, the right area, the upper left area, the upper right area, the lower left area, and lower right area are identical to a first mask line width, line widths of the upper area, the lower area, the upper left vertex area, the upper right vertex area, the lower left vertex area, and the lower right vertex area are identical to a second mask line width, the second mask line width is greater than the first mask line width, and the first mask line width is greater than the basic mask line width.

6. The method as set forth in claim 5, wherein the reference mask line width is 50 nm, the first mask line width is 56 nm, and the second mask line width is 60 nm.

7. A method of manufacturing a wire grid polarizer by exposing a mask on a substrate in a first direction and a second direction to perform a stitching process, comprising:

performing a first exposure process on the substrate such that first shots of the mask contact each other in the first direction; and performing a second exposure process on the substrate such that second shots of the mask contact each other to be spaced apart from the first shots in the second direction and have an offset with the first shots in the first direction, wherein:

each of the first shots and each of the second shots comprises:

a reference energy area exposed to reference energy;

a one-time interference area having energy higher than the reference energy due to interference of the first shots and the second shots; and a two-times interference area having energy higher than the reference energy due to interference of the first shots and the second shots;

a one-time interference mask area of the mask corresponding to the one-time interference area has a first mask line width greater than a basic mask line width of a reference energy mask area of the mask corresponding to the reference energy area, and a two-times energy mask area of the mask corresponding to the two-times interference area has a second mask line width greater than a mask line width of the reference energy mask area of the mask corresponding to the reference energy area.

8. A method of forming a line and space pattern by exposing a mask on a substrate in a first direction and a second direction to perform a stitching process, the method comprising:

performing a first exposure process on the substrate such that first shots of the mask contact each other in the first direction; and performing a second exposure process on the substrate such that second shots of the mask contact each other to be spaced apart from the first shots in the second direction and have an offset with the first shots in the first direction, wherein:

the mask comprises:

a rectangular reference energy mask area;

a left area and a right area, respectively on left and right sides of the reference energy mask area;

an upper left vertex area and an upper right vertex area, respectively in an upper left portion and an upper right portion of the reference energy mask area;

a lower left vertex area and an upper lower vertex area, respectively in a lower left portion and a lower right portion of the reference energy mask area;

an upper area above the reference energy mask area;

an upper left area between the upper area and the upper left vertex area;

an upper right area between the upper area and the upper right vertex area;

a lower area below the reference energy mask area;

a lower left area between the lower area and the lower left vertex area; and a lower right area between the lower area and the lower left vertex area, a line width of the reference energy mask area is a basic mask line width, line widths of the left area, the right area, the upper left area, the upper right area, the lower left area, and lower right area are identical to a first mask line width, line widths of the upper area, the lower area, the upper left vertex area, the upper right vertex area, the lower left vertex area, and the lower right vertex area are identical to a second mask line width, the second mask line width is greater than the first mask line width, and the first mask line width is greater than the basic mask line width.

9. The method as set forth in claim 8, wherein:

the reference mask line width is 50 nm, the first mask line width is 56 nm, and the second mask line width is 60 nm.

10. The method as set forth in claim 8, wherein the offset is greater than a width of an interference area of the shots.

11. The method as set forth in claim 8, wherein each of the first shots and each of the second shots comprises:

a reference energy area exposed to reference energy;

a one-time interference area having energy higher than the reference energy due to interference of the first shots and the second shots; and a two-times interference area having energy higher than the reference energy due to interference of the first shots and the second shots.

12. The method as set forth in claim 8, wherein the first shots and the second shots have a same pitch of the line and space pattern, and a pitch of photoresist of the line and space pattern is 80 nm to 140 nm.

13. A method of manufacturing a wire grid polarizer by exposing a mask on a substrate in a first direction and a second direction to perform a stitching process, the method comprising:

performing a first exposure process on the substrate such that first shots of the mask contact each other in the first direction; and performing a second exposure process on the substrate such that second shots of the mask contact each other to be spaced apart from the first shots in the second direction and have an offset with the first shots in the first direction, wherein:

the mask comprises:

a rectangular reference energy mask area;

a left area and a right area, respectively on left and right sides of the reference energy mask area;

an upper left vertex area and an upper right vertex area, respectively in an upper left portion and an upper right portion of the reference energy mask area;

a lower left vertex area and an upper lower vertex area, respectively in a lower left portion and a lower right portion of the reference energy mask area;

an upper area above the reference energy mask area;

an upper left area between the upper area and the upper left vertex area;

an upper right area between the upper area and the upper right vertex area;

a lower area below the reference energy mask area;

a lower left area between the lower area and the lower left vertex area; and a lower right area between the lower area and the lower left vertex area, a line width of the reference energy mask area is a basic mask line width, line widths of the left area, the right area, the upper left area, the upper right area, the lower left area, and lower right area are identical to a first mask line width, line widths of the upper area, the lower area, the upper left vertex area, the upper right vertex area, the lower left vertex area, and the lower right vertex area are identical to a second mask line width, the second mask line width is greater than the first mask line width, and the first mask line width is greater than the basic mask line width.

* * * * *